United States Patent
Sasaki et al.

(10) Patent No.: US 8,179,306 B2
(45) Date of Patent: May 15, 2012

(54) HIGH-FREQUENCY CIRCUIT BOARD, HIGH-FREQUENCY CIRCUIT MODULE, AND RADAR APPARATUS

(75) Inventors: Hajime Sasaki, Soraku-gun (JP); Kazuki Hayata, Soraku-gun (JP)

(73) Assignee: Kyocera Corporation, Kyoto (JP)

( * ) Notice: Subject to any disclaimer, the term of this patent is extended or adjusted under 35 U.S.C. 154(b) by 289 days.

(21) Appl. No.: 12/595,820

(22) PCT Filed: Mar. 31, 2008

(86) PCT No.: PCT/JP2008/056441
§ 371 (c)(1), (2), (4) Date: Oct. 27, 2009

(87) PCT Pub. No.: WO2008/129923
PCT Pub. Date: Oct. 30, 2008

(65) Prior Publication Data
US 2010/0141350 A1  Jun. 10, 2010

(30) Foreign Application Priority Data
Apr. 13, 2007  (JP) ................................. 2007-106564

(51) Int. Cl.
*G01S 7/28* (2006.01)
(52) U.S. Cl. ...................................................... 342/175
(58) Field of Classification Search .................. 342/175; 333/1.1, 239, 137
See application file for complete search history.

(56) References Cited

U.S. PATENT DOCUMENTS

| | | | |
|---|---|---|---|
| 5,929,518 A * | 7/1999 | Schlaiss | 257/712 |
| 6,476,463 B1 * | 11/2002 | Kaneko et al. | 257/660 |
| 6,768,401 B2 | 7/2004 | Koriyama | |
| 6,791,438 B2 * | 9/2004 | Takahashi et al. | 333/208 |
| 6,873,529 B2 | 3/2005 | Ikuta et al. | |
| 7,336,221 B2 | 2/2008 | Matsuo et al. | |
| 7,602,333 B2 * | 10/2009 | Hiramatsu et al. | 342/175 |
| 2002/0140532 A1 | 10/2002 | Koriyama | |
| 2002/0166689 A1 * | 11/2002 | Maetani | 174/52.4 |
| 2003/0169575 A1 | 9/2003 | Ikuta et al. | |

(Continued)

FOREIGN PATENT DOCUMENTS

JP  08330696 A  12/1996

(Continued)

OTHER PUBLICATIONS

International search report for corresponding PCT application PCT/JP2008/056441 lists the references above, May 13, 2008.

*Primary Examiner* — John B Sotomayor
(74) *Attorney, Agent, or Firm* — DLA Piper LLP (US)

(57) ABSTRACT

The invention relates to a high-frequency circuit board that can efficiently radiate heat generated in a mounted electronic component without reducing the degree of freedom in design, a high-frequency circuit module including the high-frequency circuit board, and a radar apparatus including the high-frequency circuit module. A dielectric substrate (3) includes a mounting portion (4) that is disposed on one surface (3a) of the dielectric substrate (3) and on which an electronic component (2) is to be mounted, and a waveguide (5) that is formed in the dielectric substrate (3). The mounting portion (4) and the waveguide (5) are connected with each other through a heat conductor (6) having a thermal conductivity higher than that of the dielectric substrate (3).

19 Claims, 8 Drawing Sheets

U.S. PATENT DOCUMENTS

| | | | |
|---|---|---|---|
| 2005/0088336 A1* | 4/2005 | Sakamoto et al. | 342/175 |
| 2007/0040735 A1 | 2/2007 | Matsuo et al. | |
| 2010/0141350 A1* | 6/2010 | Sasaki et al. | 333/1.1 |

FOREIGN PATENT DOCUMENTS

| | | |
|---|---|---|
| JP | 2001284803 A | 10/2001 |
| JP | 2002084208 A | 3/2002 |
| JP | 2002289737 A | 10/2002 |
| JP | 2003179181 A | 6/2003 |
| JP | 2003188610 A | 7/2003 |
| JP | 2003318319 A | 11/2003 |
| JP | 2005311337 A | 11/2005 |
| JP | 2006229073 A | 8/2006 |
| JP | 2007053440 A | 3/2007 |

* cited by examiner

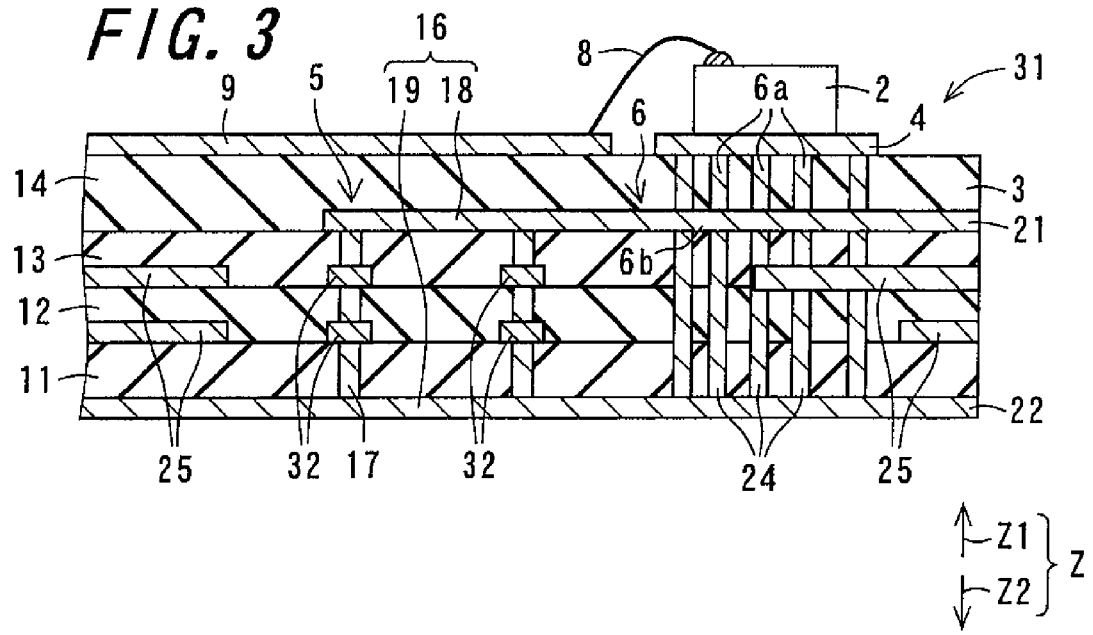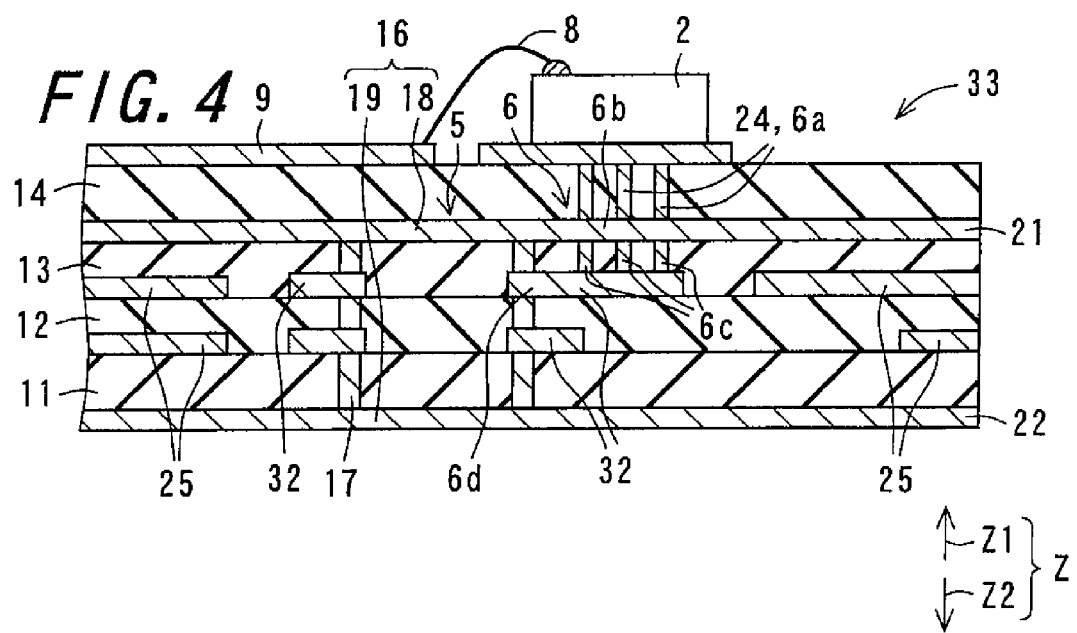

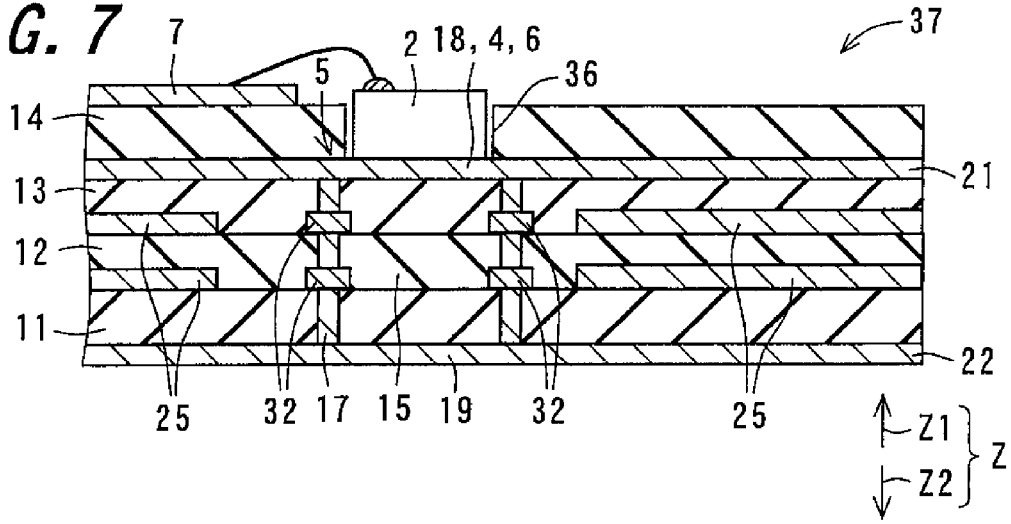
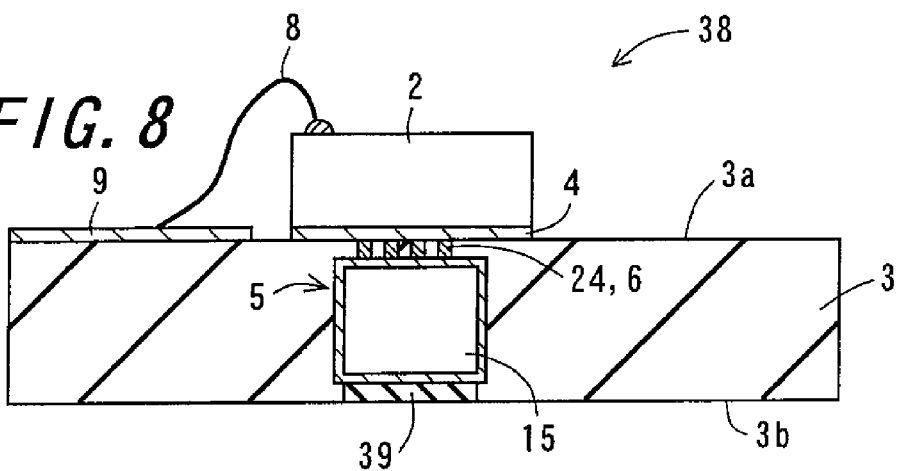
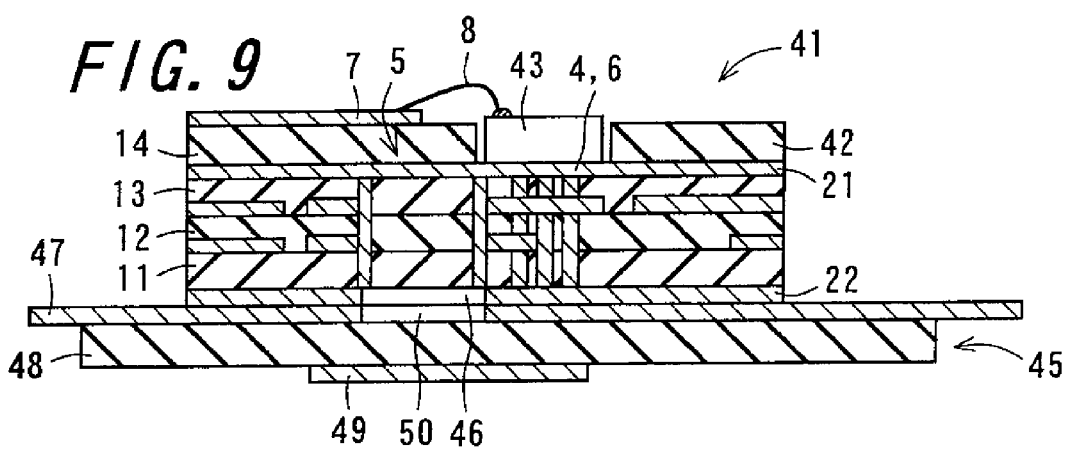

US 8,179,306 B2

HIGH-FREQUENCY CIRCUIT BOARD, HIGH-FREQUENCY CIRCUIT MODULE, AND RADAR APPARATUS

CROSS-REFERENCE TO THE RELATED APPLICATIONS

This application is a national stage of International Application No. PCT/JP2008/056441 filed on Mar. 31, 2008 and claims the benefit of priority under 35 USC 119 of Japanese Patent Application No. 2007-106564 filed on Apr. 13, 2007, which applications are incorporated herein by reference.

TECHNICAL FIELD

The present invention relates to a high-frequency circuit board on which an electronic component can be mounted, a high-frequency circuit module including the high-frequency circuit board, and a radar apparatus including the high-frequency circuit module.

BACKGROUND ART

Examples of a transmission line that transmits a high-frequency signal include transmission lines for planar circuits, such as a microstrip line and a coplanar line. There is a high-frequency circuit board in which such transmission lines are formed on a dielectric substrate. Furthermore, there is a high-frequency circuit board in which a waveguide is formed in the board in addition to the transmission lines for planar circuits (see Japanese Unexamined Patent Publication JP-A 2002-289737, for example). When electronic components, such as an MMIC (Microwave Monolithic Integrated Circuit) and a passive electronic component, are mounted on this high-frequency circuit board, a high-frequency circuit module is implemented. A high-frequency circuit board on which a waveguide is formed can transmit a high-frequency signal in a millimeter wavelength region (e.g., 77 GHz) at a low loss, and thus, this circuit board can be used in a high-frequency circuit module of, for example, a millimeter wave radar for preventing a vehicle from colliding.

As an electronic component has more functions, the amount of heat generated in the electronic component tends to increase. Thus, there is a demand for a high-frequency circuit board that has a reduced size, and that can allow an electronic component to stably operate, by effectively radiating heat generated in the electronic component.

In a conventional technique, an electronic component is provided with a heat sink in order to radiate heat generated in the electronic component as quickly as possible (see Japanese Unexamined Patent Publication JP-A 2003-179181, for example). Furthermore, there is a high-frequency circuit board in which an electronic component is mounted on one surface of the board, a heat-radiating plate is disposed on the other surface of the board, and a through-conductor that connects the electronic component and the heat-radiating plate is formed in the board (see Japanese Unexamined Patent Publications JP-A 8-330696 (1996) and JP-A 2001-284803, for example). In this sort of high-frequency circuit board, heat generated in the electronic component moves through the through-conductor to the heat-radiating plate, and is radiated from the heat-radiating plate.

In the case where a heat sink is attached to an electronic component, for example, there are problems in that the number of steps increases because a step of attaching a heat sink is necessary after the electronic component is mounted, and in that the degree of freedom in design is reduced because a space for attaching a heat sink has to be secured.

Furthermore, in the case where a through-conductor for radiating heat is disposed in the board, both the waveguide and the through-conductor are formed in the board. Accordingly, these constituent elements cross each other in a complex manner in the board, and thus, there are problems in that the degree of freedom in design is reduced, and in that the size of the board increases.

DISCLOSURE OF INVENTION

It is an object of the invention to provide a high-frequency circuit board that can efficiently radiate heat generated in a mounted electronic component without reducing the degree of freedom in design, a high-frequency circuit module including the high-frequency circuit board, and a radar apparatus including the high-frequency circuit module.

The invention is directed to a high-frequency circuit board, comprising:
  a dielectric substrate;
  a mounting portion which is disposed on a surface of the dielectric substrate and on which an electronic component is to be mounted;
  a waveguide formed in the dielectric substrate; and
  a heat conductor which is formed throughout a portion between the mounting portion and the waveguide and has a thermal conductivity higher than a thermal conductivity of the dielectric substrate.

Moreover, the invention is directed to a high-frequency circuit module, comprising:
  the high-frequency circuit board mentioned above; and
  a high-frequency oscillator which is mounted on the mounting portion and generates a high-frequency signal,
  wherein the high-frequency circuit board comprises a transmission line comprising one end connected to the high-frequency oscillator, transmitting a high-frequency signal from the high-frequency oscillator, and comprising at another end thereof an antenna port electromagnetically coupled to a transmitting antenna that emits a high-frequency signal, and
  the waveguide constitutes at least a part of the transmission line.

Moreover, the invention is directed to a high-frequency circuit module, comprising:
  the high-frequency circuit board mentioned above; and
  a high-frequency detector which is mounted on the mounting portion and that detects a high-frequency signal,
  wherein the high-frequency circuit board comprises a transmission line comprising one end connected to the high-frequency detector, comprising at another end thereof an antenna port electromagnetically coupled to a receiving antenna that captures a high-frequency signal, and transmitting a high-frequency signal given from the antenna port, and
  the waveguide constitutes at least a part of the transmission line.

Moreover, the invention is directed to a high-frequency circuit module, comprising:
  the high-frequency circuit board mentioned above; and
  a high-frequency oscillator which is mounted on the mounting portion and generates a high-frequency signal,
  wherein the high-frequency circuit board comprises:
    a first transmission line which is connected to the high-frequency oscillator and that transmits a high-frequency signal;
    a branch which comprises a first terminal, a second terminal, and a third terminal, which is connected to the first transmission line at the first terminal, and which selectively outputs a high-frequency signal given to the first terminal, to the second terminal or the third terminal;
a second transmission line which is connected to the second terminal and transmits a high-frequency signal given from the second terminal;
a divider which comprises a fourth terminal, a fifth terminal, and a sixth terminal, which outputs a high-frequency signal given via the second transmission line to the fourth terminal, to the fifth terminal, and which outputs a high-frequency signal given to the fifth terminal, to the sixth terminal;
a third transmission line which comprises one end connected to the fifth terminal, which comprises at another end thereof an antenna port electromagnetically coupled to a transmitting/receiving antenna that emits and captures a high-frequency signal, which transmits a high-frequency signal output from the fifth terminal, to the antenna port, and which transmits a high-frequency signal given from the antenna port, to the fifth terminal;
a fourth transmission line which is connected to the third terminal and transmits a high-frequency signal output from the third terminal;
a fifth transmission line which is connected to the sixth terminal and transmits a high-frequency signal output from the sixth terminal; and
a mixer which is connected to the fourth and the fifth transmission lines, and mixes high-frequency signals given from the fourth and the fifth transmission lines and outputs an intermediate frequency signal,
the waveguide constitutes at least a part of at least any one of the first to the fifth transmission lines.

Moreover, the invention is directed to a high-frequency circuit module, comprising:
the high-frequency circuit board mentioned above; and
a high-frequency oscillator which is mounted on the mounting portion and generates a high-frequency signal,
wherein the high-frequency circuit board comprises:
a first transmission line which is connected to the high-frequency oscillator and transmits a high-frequency signal;
a branch which comprises a first terminal, a second terminal, and a third terminal, which is connected to the first transmission line at the first terminal, and which selectively outputs a high-frequency signal given to the first terminal, to the second terminal or the third terminal;
a second transmission line which comprises at one end thereof a transmitting antenna port electromagnetically coupled to a transmitting antenna that emits a high-frequency signal, which comprises another end connected to the second terminal, and which transmits a high-frequency signal given from the second terminal, to the transmitting antenna port;
a third transmission line which comprises at one end thereof a receiving antenna port electromagnetically coupled to a receiving antenna that captures a high-frequency signal, and transmits a high-frequency signal given from the receiving antenna port;
a fourth transmission line which comprises one end connected to the third terminal and that transmits a high-frequency signal output from the third terminal; and
a mixer which is connected to the another end of the third transmission line and the another end of the fourth transmission line, and mixes high-frequency signals given from the third and the fourth transmission lines and outputs an intermediate frequency signal,
the waveguide constitutes at least a part of at least any one of the first to the fourth transmission lines.

Moreover, the invention is directed to a radar apparatus, comprising:
the high-frequency circuit module mentioned above;
a transmitting/receiving antenna electromagnetically coupled to the antenna port; and
a distance detector detecting a distance from the high-frequency circuit module to a detection target based on an intermediate frequency signal from the mixer.

Moreover, the invention is directed to a radar apparatus, comprising:
the high-frequency circuit module mentioned above;
a transmitting antenna electromagnetically coupled to the transmitting antenna port;
a receiving antenna electromagnetically coupled to the receiving antenna port; and
a distance detector detecting a distance from the high-frequency circuit module to a detection target based on an intermediate frequency signal from the mixer.

BRIEF DESCRIPTION OF DRAWINGS

Other and further objects, features, and advantages of the invention will be more explicit from the following detailed description taken with reference to the drawings wherein:

FIG. 3 is a cross-sectional view showing a high-frequency circuit board according to a second embodiment of the invention;

FIG. 4 is a cross-sectional view showing a high-frequency circuit board according to a third embodiment of the invention;

FIG. 7 is a cross-sectional view showing the high-frequency circuit board viewed from section line VII-VII in FIG. 6;

FIG. 8 is a cross-sectional view showing a high-frequency circuit board according to a sixth embodiment of the invention;

FIG. 9 is a cross-sectional view showing a transmitter according to a seventh embodiment of the invention;

BEST MODES FOR CARRYING OUT THE INVENTION

Figure 1:
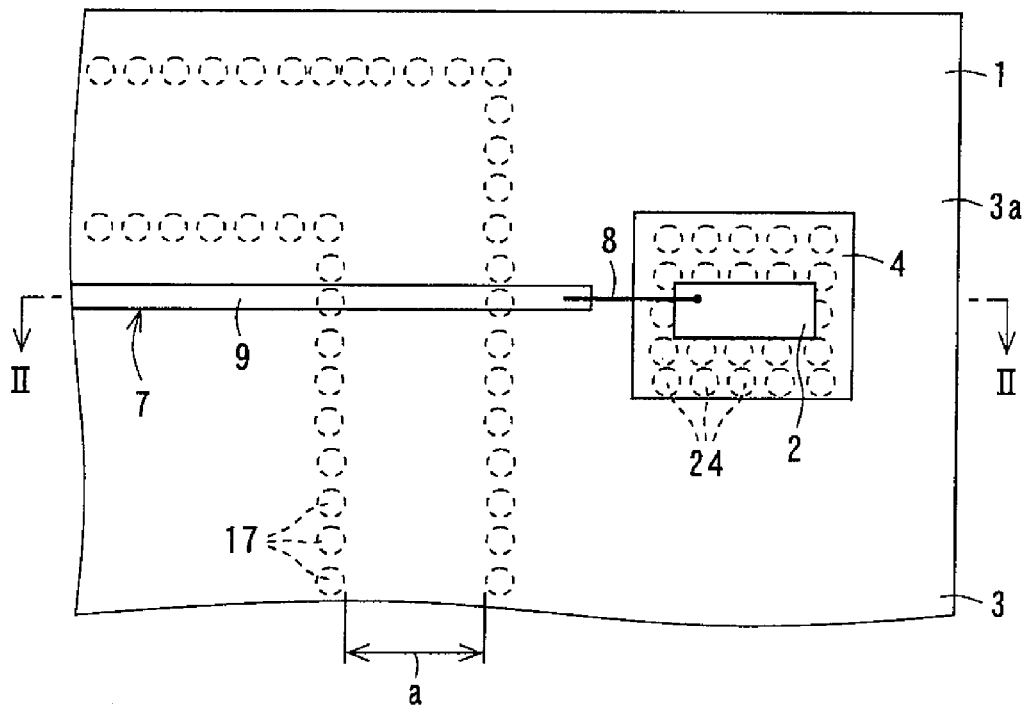
FIG. 1 is a plan view showing a high-frequency circuit board according to a first embodiment of the invention.

Now referring to the drawings, preferred embodiments of the invention are described below.

First Embodiment

Figure 2:
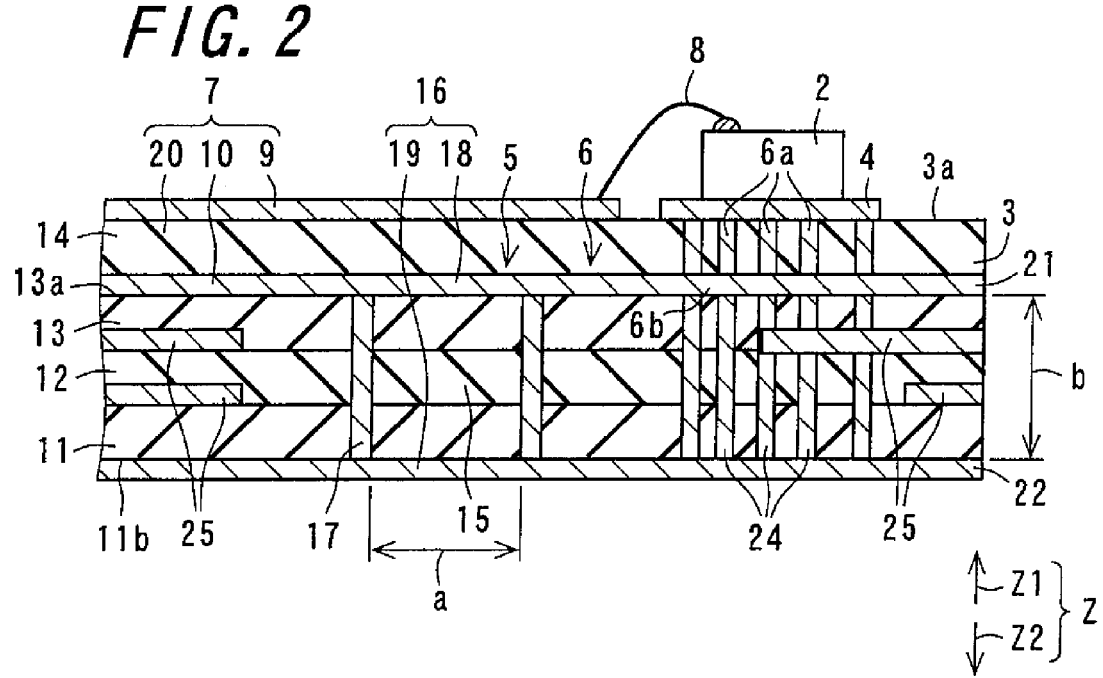
FIG. 2 is a cross-sectional view of the high-frequency circuit board viewed from section line II-II in FIG. 1.

FIG. 1 is a plan view showing a high-frequency circuit board 1 according to a first embodiment of the invention. FIG. 2 is a cross-sectional view of the high-frequency circuit board 1 viewed from section line II-II in FIG. 1. On the high-frequency circuit board 1, an electronic component 2, such as an MMIC or a passive electronic component, is mounted. When a circuit formed on the high-frequency circuit board 1 and the electronic component 2 are electrically connected, an electronic apparatus is implemented.

The high-frequency circuit board 1 includes a dielectric substrate 3, a mounting portion 4 that is disposed on the surface of the dielectric substrate 3 and on which the electronic component 2 is to be mounted, a waveguide 5 that is formed in the dielectric substrate 3, and a heat conductor 6 that is formed throughout a portion between the mounting portion 4 and the waveguide 5 and that has a thermal conductivity higher than the thermal conductivity of the dielectric substrate 3.

The dielectric substrate 3 further has a planar line 7 that is electrically connected to the electronic component 2 and that transmits an electrical signal. The planar line 7 is implemented by means of a planar line, such as a strip line, a microstrip line, a slot line, and a coplanar line, and is implemented by means of a microstrip line in this embodiment. On one surface 3a of the dielectric substrate 3, a strip conductor 9 is formed so as to linearly extend as an electrically conductive line.

The dielectric substrate 3 is made of a dielectric ceramics, a glass ceramics, glass, a resin material, a liquid crystal polymer, a mixture of resin and ceramics, or the like. The dielectric substrate 3 is configured by layering one or a plurality of layers, and is configured by layering first to fourth dielectric layers 11, 12, 13, and 14 in this order in this embodiment.

The mounting portion 4 is formed on the one surface 3a of the dielectric substrate 3, and is formed in the shape of an elongated thin plate in this embodiment. The mounting portion 4 is disposed close to one end of the planar line 7. The mounting portion 4 in this embodiment is disposed at a position that does not overlap the waveguide 5 when viewed from an upper side in a vertical direction (hereinafter, simply referred to as an "upper side Z1"). That is to say, the waveguide 5 is not disposed on a lower side in the vertical direction (hereinafter, simply referred to as an "lower side Z2") of the mounting portion 4, and the waveguide 5 is disposed at a position that is different from a portion on the lower side Z2 of the mounting portion 4.

The electronic component 2 is mounted on the mounting portion 4. In this embodiment, an MMIC in the form of a bare chip made of a semiconductor material, such as gallium arsenic (GaAs), silicon-germanium (SiGe), or indium phosphorus (InP)-based material, is used as the electronic component 2. In this embodiment, the electronic component 2 in the form of a bare chip is attached to and mounted on the mounting portion 4 using an alloy such as solder, an electrically conductive adhesive, or a resin adhesive. An input terminal, an output terminal, or an input-output terminal of the electronic component 2 and the planar line 7 are electrically connected to each other via an electrically conductive connector 8. The connector 8 is implemented by means of a bonding wire, a wire ribbon, a bump, or the like, and is implemented by means of a bonding wire in this embodiment.

The waveguide 5 is formed so as to cover a part of the first to the third dielectric layers 11, 12, and 13. The portions of the first to the third dielectric layers 11, 12, and 13 covered by the waveguide 5 function as a waveguide line 15 through which a high-frequency signal is transmitted. The waveguide line 15 is implemented by means of a dielectric having a dielectric constant larger than that of air, and thus, the wavelength of an electrical signal propagated through the waveguide 5 is shorter than that of a hollow waveguide. Thereby, the size of the waveguide 5 can be reduced compared to that of a hollow waveguide, and the size of the high-frequency circuit board 1 can be also reduced.

The waveguide 5 in this embodiment includes a pair of main conductive layers 16 that extend in the same direction so that the surfaces thereof oppose each other, and that are electrically conductive; and a plurality of waveguide-forming conductive columns 17 that are electrically conductive, that are formed throughout a portion between the pair of main conductive layers 16, and that are arranged in two lines along a transmitting direction of an electrical signal so that a distance therebetween in the transmitting direction is a cutoff wavelength or shorter. The waveguide 5 is set as appropriate according to a circuit formed on the high-frequency circuit board 1. FIG. 1 shows a waveguide 5 in the shape of an L.

The pair of main conductive layers 16 include one main conductive layer 18 that is formed on a surface 13a of the third dielectric layer 13 on the upper side Z1, and another main conductive layer 19 that is formed on a surface 11b of the first dielectric layer 11 on the lower side Z2.

In this embodiment, an intermediate conductive layer 21 that extends from the waveguide 5 at least to a portion on the lower side Z2 of the mounting portion 4 is formed on the surface 13a of the third dielectric layer 13 on the upper side Z1. This intermediate conductive layer 21 is continued to the one main conductive layer 18, and is connected together with the one main conductive layer 18. A part of the intermediate conductive layer 21 functions as the one main conductive layer 18. Furthermore, a lower-face conductive layer 22 is formed substantially throughout the surface 11b of the first dielectric layer 11 on the lower side Z2, for example, excluding a portion through which a high-frequency signal is propagated between another high-frequency circuit such as an antenna and the waveguide 15. This lower-face conductive layer 22 is connected together with the another main conductive layer 19 so that a part of the lower-face conductive layer 22 functions as the another main conductive layer 19.

Each of the waveguide-forming conductive columns 17 in this embodiment extends in a vertical direction Z and connects the one main conductive layer 18 and the another main conductive layer 19. A cross-section of each of the waveguide-forming conductive columns 17 perpendicular to the vertical direction Z is in the shape of a circle, a polygon, an ellipse, or the like, and the shape may vary depending on the position in the vertical direction Z. The waveguide-forming conductive columns 17 in this embodiment are formed in the shape of cylinders.

A gap is formed between the waveguide-forming conductive columns 17 arranged adjacent to each other. The waveguide-forming conductive columns 17 are arranged so that a distance therebetween in the transmitting direction is a cutoff wavelength or shorter, and thus, leakage of a high-frequency signal from the gap between the waveguide-forming conductive columns 17 arranged adjacent to each other is suppressed. In other words, the plurality of waveguide-forming conductive columns 17 arranged in each line function as a pair of side walls for a high-frequency signal.

The pair of main conductive layers 16 and the plurality of waveguide-forming conductive columns 17 implement the waveguide 5 that functions in a similar manner as a square waveguide. A distance a between the waveguide-forming conductive columns 17 in a width direction perpendicular to the vertical direction Z and the transmitting direction corresponds to a distance of a square waveguide in the width direction, and a distance b between the one main conductive layer 18 and the another main conductive layer 19 corresponds to a distance of a square waveguide in the height direction. The cutoff frequency is determined according to the distances a and b. In the case where the waveguide 5 is made of a material having a large coefficient of thermal expansion, when the waveguide 5 deforms with changes in temperature, the distances a and b change, and thus, the cutoff frequency changes. Thus, the shape of the waveguide 5 is determined according to the coefficient of thermal expansion, the temperature change range, and the frequency of a high-frequency signal that is to be propagated through the waveguide 5 so that the cutoff frequency is not larger than the frequency of the high-frequency signal that is to be propagated.

The dielectric substrate 3 further has one or a plurality of heat-radiating conductive columns 24 that extend toward the lower side Z2 from the mounting portion 4 to the lower-face conductive layer 22. As described above, the intermediate conductive layer 21 is formed on a portion on the lower side Z2 of the mounting portion 4, and thus, the heat-radiating conductive columns 24 are connected to the intermediate conductive layer 21. Due to the heat-radiating conductive columns 24, the potential of the mounting portion 4 is the same as that of the lower-face conductive layer 22. Thus, when the potential of the lower-face conductive layer 22 is set as a reference potential, the potential of the mounting portion 4 is also kept at the reference potential. The heat-radiating conductive columns 24 are formed in a similar manner to that of the waveguide-forming conductive columns 17.

Furthermore, the dielectric substrate 3 in this embodiment has metallized layers 25 respectively between the second dielectric layer 12 and the third dielectric layer 13 and between the third dielectric layer 13 and the fourth dielectric layer 14. The above-described heat-radiating conductive columns 24 are partially connected to the metallized layers 25.

The heat conductor 6 formed throughout a portion between the mounting portion 4 and the waveguide 5 includes portions 6a that are arranged in the heat-radiating conductive columns 24 between the mounting portion 4 and the intermediate conductive layer 21, and a portion 6b that is disposed in the intermediate conductive layer 21 between the waveguide 5 and the heat-radiating conductive columns 24.

Furthermore, the dielectric substrate 3 has a grounding conductive layer 10 that is formed wider than the strip conductor 9 in a direction perpendicular to the transmitting direction of a high-frequency signal propagated through the planar line 7 and the vertical direction Z, on the lower side Z2 of the strip conductor 9. This grounding conductive layer 10 is formed so as to extend from a main conductive layer (the one main conductive layer 18) closer to the one surface 3a of the dielectric substrate 3, of the pair of main conductive layers 16, includes this main conductive layer (the one main conductive layer 18), and is connected together with this main conductive layer. That is to say, the grounding conductive layer 10 is formed on the surface 13a of the third dielectric layer 13 in this embodiment. In other words, the strip conductor 9 is disposed on the one surface 3a of the dielectric substrate 3, in a region where the grounding conductive layer 10 is formed when viewed from the upper side Z1. The grounding conductive layer 10 is electrically connected via the waveguide 5 to the lower-face conductive layer 22. Thus, when the potential of the lower-face conductive layer 22 is set to a reference potential, the potential of the grounding conductive layer 10 is the same as the reference potential. The waveguide 5 is formed at a position away from at least the one surface 3a of the dielectric substrate 3 toward the other surface. The fourth dielectric layer 14 is interposed between the grounding conductive layer 10 and the strip conductor 9. This strip conductor 9, the grounding conductive layer 10, and a dielectric 20 in the fourth dielectric layer 14 interposed between the strip conductor 9 and the grounding conductive layer 10 function as a microstrip line, and implement the above-described planar line 7.

In this embodiment, a slot that passes in the vertical direction Z through the one main conductive layer 18 on the lower side Z2 of the strip conductor 9 and that extends in the direction in which the strip conductor 9 extends is formed. Via this slot, a high-frequency signal propagated through the planar line 7 is propagated to the waveguide 5, and is further propagated through the waveguide 5, or a high-frequency signal propagated through the waveguide 5 is propagated to the planar line 7, and is further propagated through the planar line 7. Thereby, for example, a high-frequency signal output from the electronic component 2 via the connector 8 to the planar line 7 is propagated through the waveguide 5.

Hereinafter, a method for producing the high-frequency circuit board 1 will be described. First, for example, an appropriate organic solvent or another solvent is added to and mixed with a material powder such as alumina and silica ($SiO_2$) to form a slurry, this slurry is shaped into ceramic green sheets in the form of sheets using a doctor blade method and a calender roll method, and thus, ceramic green sheets for the first to the fourth dielectric layers 11, 12, 13, and 14 are prepared.

Next, the ceramic green sheets for the first to the fourth dielectric layers 11, 12, 13, and 14 are processed using a processing method, such as a punching method with a die or a punch, or laser beam machining, and thus, through-holes for the waveguide-forming conductive columns 17 and the heat-radiating conductive columns 24 are formed. Next, the formed through-holes are filled with a metallized paste using a printing method, such as a screen printing method, and a metallized paste for the mounting portion 4, the strip conductor 9, the intermediate conductive layer 21, the lower-face conductive layer 22, the metallized layers 25, and the like are printed and applied.

Next, the ceramic green sheets for the first to the fourth dielectric layers 11, 12, 13, and 14 are fired at a high temperature of, for example, approximately 1500 to 1800° C., and thus, the high-frequency circuit board 1 is produced.

The mounting portion 4, the strip conductor 9, the intermediate conductive layer 21, the lower-face conductive layer 22, and the metallized layers 25 are mainly made of an electrically conductive metal, such as Cu (copper), Ag (silver), W (tungsten), Mo (molybdenum), Al (aluminum), Ni (nickel), and Au (gold). More specifically, the mounting portion 4, the strip conductor 9, the intermediate conductive layer 21, the lower-face conductive layer 22, and the metallized layers 25 are made of a high-melting-point metal material, such as W and Mo, in the case where the dielectric substrate 3 is made of alumina; and are made of Cu, Ag, and the like in the case where the dielectric substrate 3 is made of glass ceramics.

According to the high-frequency circuit board 1 of this embodiment described above, the waveguide 5 and the mounting portion 4 are connected to each other via the heat conductor 6 having a thermal conductivity higher than the thermal conductivity of the dielectric substrate 3. When the electronic component 2 is mounted on the mounting portion 4 of the thus-configured dielectric substrate 3, heat generated in the electronic component 2 is conducted via the heat conductor 6 to the waveguide 5, and radiated in the direction in which the waveguide 5 extends. When heat is moved from the electronic component 2 to the waveguide 5 formed in the dielectric substrate 3 in this manner, heat can be radiated not only in the thickness direction of the dielectric substrate 3 but also in the direction in which the waveguide 5 extends, and thus, heat can be more efficiently radiated than in the case where heat is radiated in the thickness direction of a dielectric substrate in a conventional manner. Furthermore, since the waveguide 5 functions as a heat-radiating mechanism, a heat-radiating plate does not have to be provided as in a conventional technique. Thus, the cost can be lowered, and the size of the apparatus can be reduced. Furthermore, since a through-conductor that passes through a dielectric substrate does not have to be provided as in a conventional technique in order to connect the mounting portion and the heat-radiating plate, for example, the waveguide 5 can be formed as a circuit in a region that overlaps the mounting portion 4 when viewed from one side in the thickness direction of the dielectric substrate 3, or a circuit or the like other than the waveguide 5 can be formed. Thus, a reduction in the degree of freedom in design caused by disposing a heat-radiating mechanism can be suppressed.

Furthermore, according to the high-frequency circuit board 1 of this, embodiment, the plurality of waveguide-forming conductive columns 17 arranged in two lines are arranged so that a distance therebetween in the transmitting direction of an electrical signal is a cutoff wavelength or shorter, and thus, leakage of an electronic signal passing through the waveguide 5, from the gap between the waveguide-forming conductive columns 17, can be suppressed. Thus, the pair of main conductive layers 16 and the plurality of waveguide-forming conductive columns 17 form the waveguide 5, and the region defined by the pair of main conductive layers 16 and the plurality of waveguide-forming conductive columns 17 arranged in two lines functions as the waveguide line 15. This sort of waveguide 5 is formed in a commonly performed step of producing a ceramic substrate by layering ceramic green sheets as described above, and thus, this embodiment has an excellent mass-productivity, for example, compared with a high-frequency circuit board in which a waveguide is embedded in a dielectric substrate.

Furthermore, according to the high-frequency circuit board 1 of this embodiment, when the strip conductor 9, the grounding conductive layer 10, and the dielectric 20 in the fourth dielectric layer 14 interposed between the strip conductor 9 and the grounding conductive layer 10 form the planar line 7, circuits can be formed in a stepwise manner in the vertical direction Z of the dielectric substrate 3. Thus, the size of the high-frequency circuit board 1 can be reduced.

Furthermore, according to the high-frequency circuit board 1 of this embodiment, the heat-radiating conductive columns 24 and the metallized layers 25 are connected, and thus, heat generated in the electronic component 2 is conducted via the mounting portion 4 and the heat-radiating conductive columns 24 to the metallized layers 25, and is efficiently radiated.

Second Embodiment

FIG. 3 is a cross-sectional view showing a high-frequency circuit board 31 according to a second embodiment of the invention. The high-frequency circuit board 31 of this embodiment has substantially a similar configuration to that of the high-frequency circuit board 1 of the first embodiment, and thus, corresponding portions in the configuration are denoted by the same names and the same reference numerals, and a description thereof will not be repeated.

The high-frequency circuit board 31 in this embodiment further includes a pair of electrically conductive sub conductive layers 32 that extend in the transmitting direction of an electrical signal of the waveguide 5 and that individually electrically connect the plurality of waveguide-forming conductive columns 17 for each line. The high-frequency circuit board 33 may only be provided with at least a pair of sub conductive layers 32, and is provided with two pairs of sub conductive layers 32 in this embodiment.

One pair of sub conductive layers 32 of the two pairs of sub conductive layers 32 are arranged between the second dielectric layer 12 and the third dielectric layer 13, and the other pair of sub conductive layers 32 are arranged between the first dielectric layer 11 and the second dielectric layer 12. Each of the sub conductive layers 32 is formed so as to slightly project from the waveguide-forming conductive columns 17 both on one side and the other side in the width direction of the waveguide 5.

According to the high-frequency circuit board 31 of this embodiment described above, heat moved from the electronic component 2 to the waveguide 5 is moved along the sub conductive layers 32 in addition to the main conductive layers 16. Thus, heat can be more efficiently radiated. Furthermore, the sub conductive layers 32 exert the function of confining electromagnetic waves in the waveguide line 15. Thus, the transmission loss of the waveguide 5 can be reduced. Furthermore, even in a case where the positions of the waveguide-forming conductive columns 17 are shifted from each other when the ceramic green sheets for the first to the fourth dielectric layers 11, 12, 13, and 14 are layered, the waveguide-forming conductive columns 17 can be electrically connected via the sub conductive layers 32.

Third Embodiment

FIG. 4 is a cross-sectional view showing a high-frequency circuit board 33 according to a third embodiment of the invention. The high-frequency circuit board 33 of this embodiment has substantially a similar configuration to that of the high-frequency circuit board 31 of the second embodiment, and thus, corresponding portions in the configuration are denoted by the same names and the same reference numerals, and a description thereof will not be repeated.

Each pair of the sub conductive layers 32 of this embodiment are formed so as to extend from the plurality of waveguide-forming conductive columns 17 arranged in each line, in respective directions away from the waveguide 5. At least one sub conductive layer 32 is formed so as to extend from the waveguide-forming conductive column 17 to a portion on the lower side Z2 of the mounting portion 4.

The mounting portion 4 of this embodiment is disposed at a position where the mounting portion 4 partially overlaps the waveguide 5 and partially overlaps the sub conductive layer 32 when viewed from the upper side Z1.

The heat-radiating conductive columns 24 in this embodiment are arranged at a position where the mounting portion 4 overlaps the sub conductive layer 32 when viewed from the upper side Z1, and are formed throughout a portion between the mounting portion 4 and the sub conductive layer 32. These heat-radiating conductive columns 24 are also connected to the intermediate conductive layer 21. The heat conductor 6 includes portions 6a that are arranged in the heat-radiating conductive columns 24 between the mounting portion 4 and the intermediate conductive layer 21, a portion 6b that is disposed in the intermediate conductive layer 21 between the waveguide 5 and the heat-radiating conductive columns 24, portions 6c that are arranged in the heat-radiating conductive columns 24 between the mounting portion 4 and the sub conductive layer 32, and a portion 6d that is disposed in the sub conductive layer 32 between the waveguide 5 and the heat-radiating conductive columns 24.

According to the high-frequency circuit board 33 of this embodiment described above, the sub conductive layers 32 are formed so as to extend from a plurality of waveguide-forming conductive columns 17 arranged in each line, in respective directions away from the waveguide 5. Thus, the heat-radiating area of the sub conductive layers 32 is larger than that in the foregoing embodiments, and heat generated in the electronic component 2 can be more efficiently radiated. Furthermore, the sub conductive layers 32 and the heat-radiating conductive columns 24 are connected. Thus, heat generated in the electronic component 2 can be directly conducted to the sub conductive layers 32, and heat can be more efficiently radiated.

Fourth Embodiment

Figure 5:
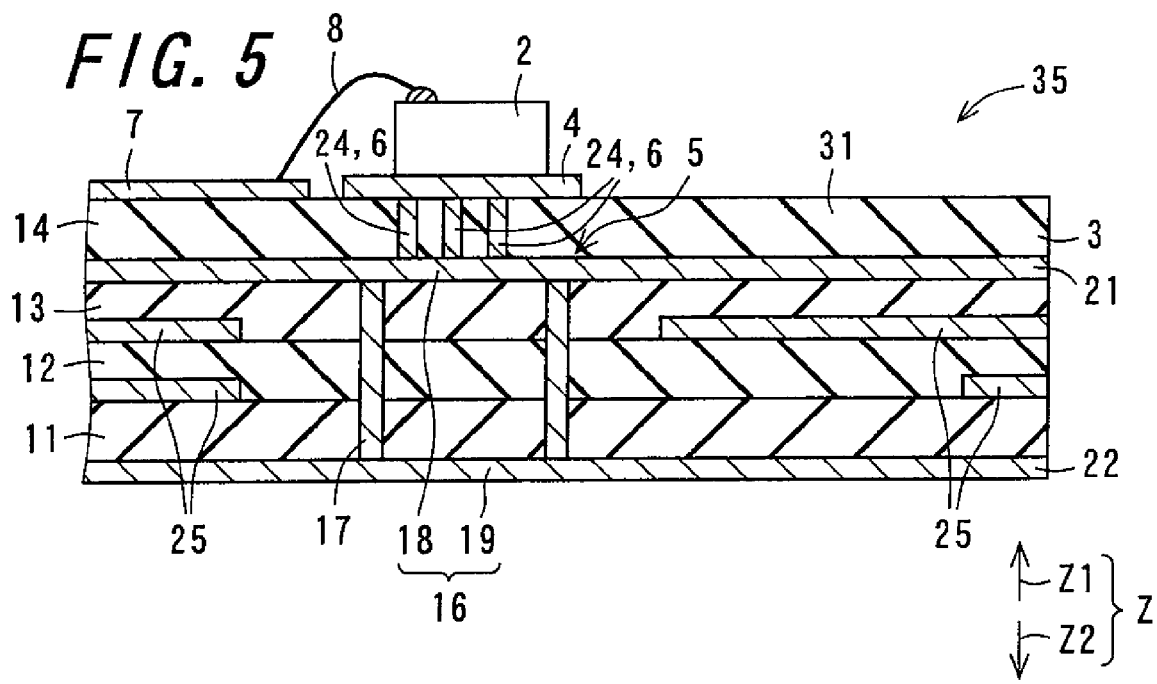
FIG. 5 is a cross-sectional view showing a high-frequency circuit board according to a fourth embodiment of the invention.

FIG. 5 is a cross-sectional view showing a high-frequency circuit board 35 according to a fourth embodiment of the invention. The high-frequency circuit board 35 of this embodiment has substantially a similar configuration to that of the high-frequency circuit boards 1, 31, and 33 of the foregoing embodiments, and thus, corresponding portions in the configuration are denoted by the same names and the same reference numerals, and a description thereof will not be repeated.

The high-frequency circuit board 35 of this embodiment is different from the high-frequency circuit board 1 of the first embodiment mainly in the arrangement position of the mounting portion 4. The mounting portion 4 in this embodiment is disposed at a position where the mounting portion 4 at least partially overlaps the waveguide 5 when viewed from the upper side Z1. More specifically, the mounting portion 4 is formed so as to project from the waveguide 5 both on one side and the other side in the width direction when viewed from the upper side Z1.

The heat-radiating conductive columns 24 of this embodiment correspond to the heat conductor 6, extend in the vertical direction Z, and are formed throughout a portion between the mounting portion 4 and the one main conductive layer 18.

According to the high-frequency circuit board 35 of this embodiment described above, the mounting portion 4 is disposed at a position where the mounting portion 4 at least partially overlaps the waveguide 5 when viewed from the upper side Z1, and the heat conductor 6 linearly connects the mounting portion 4 and the waveguide 5. Thus, the length of the heat conductor 6 can be reduced to the extent possible.

Thereby, heat generated in the electronic component 2 can be efficiently conducted to the waveguide 5, and heat can be efficiently radiated.

Fifth Embodiment

Figure 6:
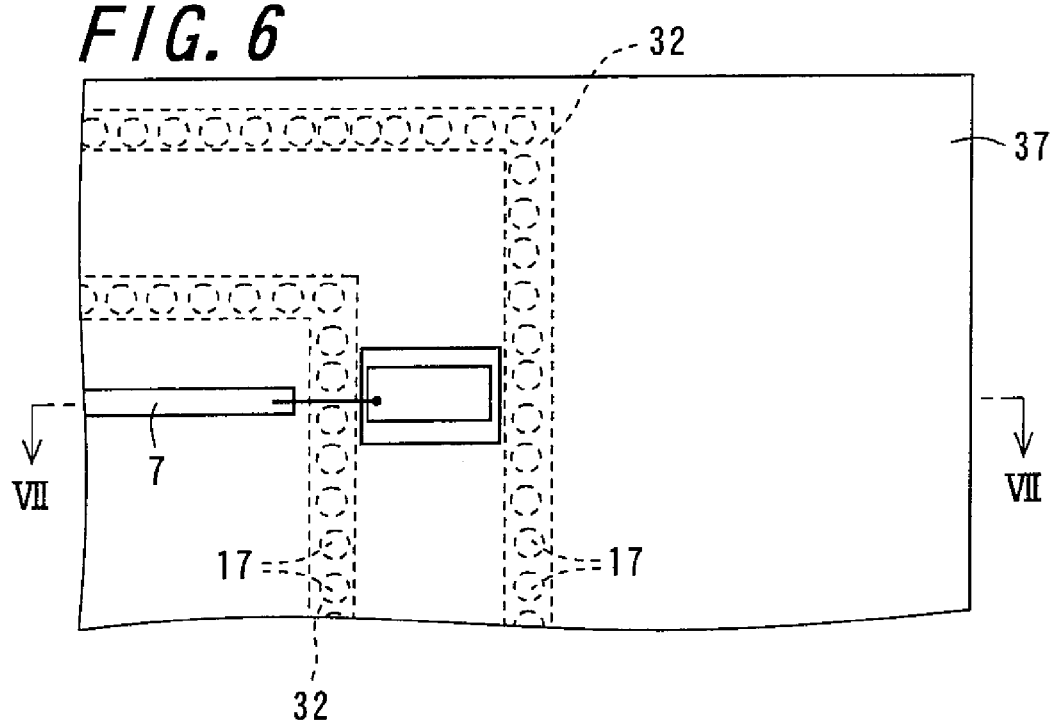
FIG. 6 is a plan view showing a high-frequency circuit board according to a fifth embodiment of the invention.

FIG. 6 is a plan view showing a high-frequency circuit board 37 according to a fifth embodiment of the invention. FIG. 7 is a cross-sectional view showing the high-frequency circuit board 37 viewed from section line VII-VII in FIG. 6. The high-frequency circuit board 37 of this embodiment has substantially a similar configuration to that of the high-frequency circuit boards 1, 31, 33, and 35 of the foregoing embodiments, and thus, corresponding portions in the configuration are denoted by the same names and the same reference numerals, and a description thereof will not be repeated.

In the dielectric substrate 3 in this embodiment, a cavity 36 that passes from the one surface 3a side to the waveguide 5 is formed. The electronic component 2 of this embodiment is mounted on a portion of the waveguide 5 exposed through the cavity in the dielectric substrate 3. That is to say, the portion of the waveguide 5 exposed through the cavity in the dielectric substrate 3, the mounting portion 4, and the heat conductor 6 are connected together. That is to say, the portion of the waveguide 5 exposed through the cavity in the dielectric substrate 3 corresponds to the mounting portion 4, and also corresponds to the heat conductor 6. This portion of the waveguide 5 also functions as the mounting portion 4 and the heat conductor 6.

According to the high-frequency circuit board 37 of this embodiment described above, the portion of the waveguide 5 exposed through the cavity in the dielectric substrate 3 also functions as the mounting portion 4 and the heat conductor 6. Thus, heat generated in the electronic component 2 mounted on the mounting portion 4 is directly conducted to the waveguide 5. Thereby, heat generated in the electronic component 2 can be more efficiently radiated.

In the high-frequency circuit board 37 of this embodiment, the cavity 36 is formed on the one main conductive layer 18, but also may be formed on a portion of the intermediate conductive layer 21 other than the one main conductive layer 18. Also in this case, the path through which heat generated in the electronic component 2 is conducted to the waveguide 5 can be made shorter, and thus, heat can be efficiently radiated.

Sixth Embodiment

FIG. 8 is a cross-sectional view showing a high-frequency circuit board 38 according to a sixth embodiment of the invention. The high-frequency circuit board 38 of this embodiment has a similar configuration to that of the high-frequency circuit boards 1, 31, 33, 35, and 37 of the foregoing embodiments, and thus, corresponding portions in the configuration are denoted by the same names and the same reference numerals, and a description thereof will not be repeated. The waveguide 5 is formed by layering dielectric layers in the high-frequency circuit boards 1, 31, 33, 35, and 37 of the foregoing embodiments, but the waveguide 5 is formed by forming the dielectric substrate 3 and then embedding the waveguide 5 in the dielectric substrate 3 in the high-frequency circuit board 38. For example, a cavity that extends from another surface 3b to the one surface 3a of the dielectric substrate 3 is formed, the waveguide 5 in the shape of a rectangle or the like is embedded in this cavity, a portion of the cavity in which the waveguide 5 is not placed is filled with an insulating layer 39 made of a thermosetting resin or the like, and thus, the waveguide 5 can be embedded in the dielectric substrate 3. The dielectric substrate 3 has a through-hole that is continued from the one surface 3a to the cavity, and the heat conductor 6 is disposed in the through-hole. In this case, the waveguide 5 may be a hollow waveguide or may be a dielectric waveguide. In the case where the waveguide 5 is made of a dielectric waveguide, the wavelength of an electrical signal is shorter than that for a hollow waveguide. Thereby, the size of the waveguide 5 can be reduced, and the high-frequency circuit board can be also reduced.

Furthermore, the high-frequency circuit boards 1, 31, 33, 35, 37, and 38 of the foregoing embodiments may further have a metal member that is in contact with the another main conductive layer 19. This metal member may be a constituent element that is necessary for design of a casing or the like, or may be a constituent element that is disposed particularly for radiating heat. Heat generated in the electronic component 2 is conducted via the heat conductor 6 and the waveguide 5 to the metal member, and thus, heat can be more efficiently radiated.

Seventh Embodiment

Figure 10:
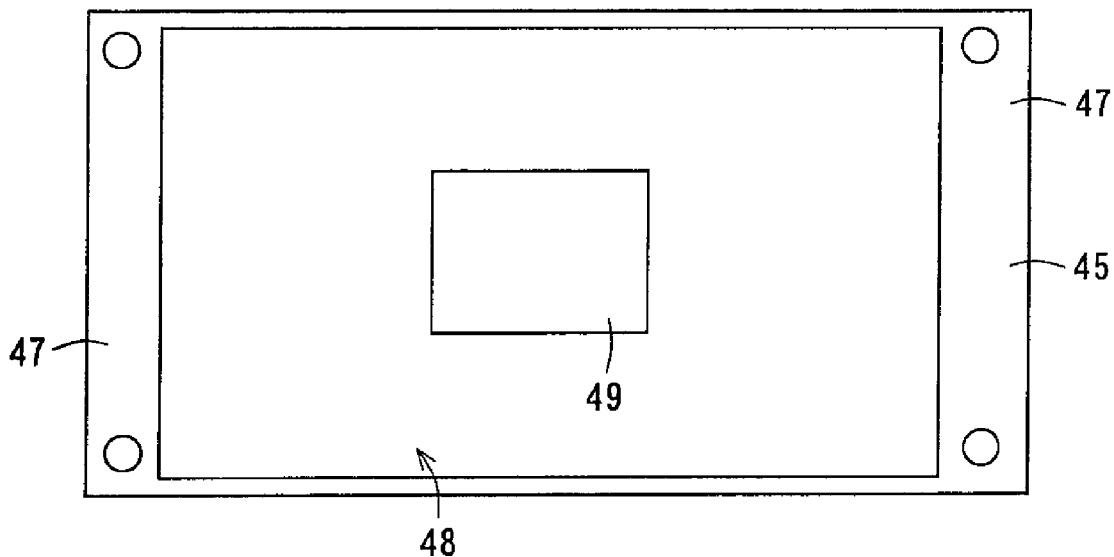
FIG. 10 is a bottom view showing the transmitter.
Figure 11:
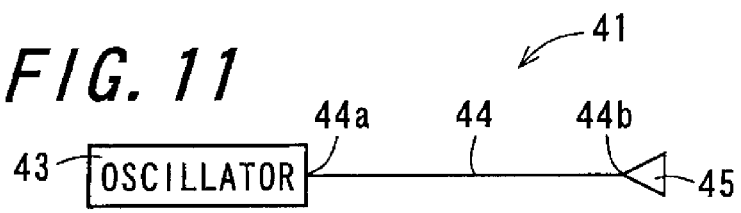
FIG. 11 is a schematic diagram showing the configuration of the transmitter.

FIG. 9 is a cross-sectional view showing a transmitter 41 according to a seventh embodiment of the invention. FIG. 10 is a bottom view showing the transmitter 41. FIG. 11 is a schematic diagram showing the configuration of the transmitter 41. The transmitter 41 has a high-frequency circuit module including a high-frequency circuit board 42 that is implemented by means of any one of the high-frequency circuit boards of the foregoing embodiments and a high-frequency oscillator 43 that is mounted on the mounting portion 4 and that generates a high-frequency signal, and a transmitting antenna 45. The high-frequency circuit board 42 of this embodiment has substantially the same configuration as the high-frequency circuit board 33 shown in FIG. 4, but a cavity is formed in the fourth dielectric layer 14, the intermediate conductive layer 21 also functions as the mounting portion 4 and the heat conductor 6, and the heat-radiating conductive columns 24 are connected to the lower-face conductive layer 22.

The high-frequency oscillator 43 includes, for example, an MMIC that functions as a Gunn oscillator using a Gunn diode, an Impatt oscillator using an Impatt diode, or an oscillator using a transistor such as an FET (field effect transistor), and generates a high-frequency signal.

The high-frequency circuit board 33 includes a transmission line 44 that has one end 44a connected to the high-frequency oscillator 43, that transmits a high-frequency signal from the high-frequency oscillator 43, and that has at another end 44b thereof with an antenna port 46 electromagnetically coupled to the transmitting antenna 45 that emits a high-frequency signal.

The transmitting antenna 45 includes a fixing conductor 47 that is in the shape of an elongated thin plate and that is made of a metal material, an antenna-dielectric substrate 48 that is formed in the shape of an elongated thin plate on the surface of the fixing conductor 47, and a planar antenna conductor 49 that is made of a metal material formed in the shape of an elongated thin plate at the center of the surface of the antenna-dielectric substrate 48.

The antenna port 46 is implemented, for example, by forming a slot that passes through the another main conductive layer in the vertical direction Z. Furthermore, the fixing conductor 47 has a slot 50 that passes through in the vertical direction Z. The transmitting antenna 45 is fixed to the high-frequency circuit board 42 so that the slot 50 formed in the fixing conductor 47 matches the antenna port 46.

The transmission line 44 is implemented by means of the above-described connector 8, the above-described planar line 7, and the waveguide 5. The planar line 7 and the waveguide 5 are electromagnetically coupled to each other via the slot that passes in the vertical direction Z through the one main conductive layer 18 of the waveguide 5 as described above.

A high-frequency signal generated by the high-frequency oscillator 43 is propagated through the transmission line 44 configured from the connector 8, the above-described planar line 7, and the waveguide 5, given to the transmitting antenna 45, and emitted as radio waves.

According to the high-frequency circuit module of this embodiment described above, heat generated in the high-frequency oscillator 43 is conducted to the waveguide 5 constituting a part of the transmission line 44, and efficiently radiated. Thus, the temperature of the high-frequency oscillator 43 can be prevented from being high, and a transmitter 41 having a high transmission output can be implemented.

Furthermore, the fixing conductor 47 is connected to the waveguide 5. Thus, heat generated in the high-frequency oscillator 43 is conducted via the waveguide 5 to the fixing conductor 47, and radiated. Thereby, the temperature of the high-frequency oscillator 43 can be more effectively prevented from being high.

Eighth Embodiment

Figure 12:
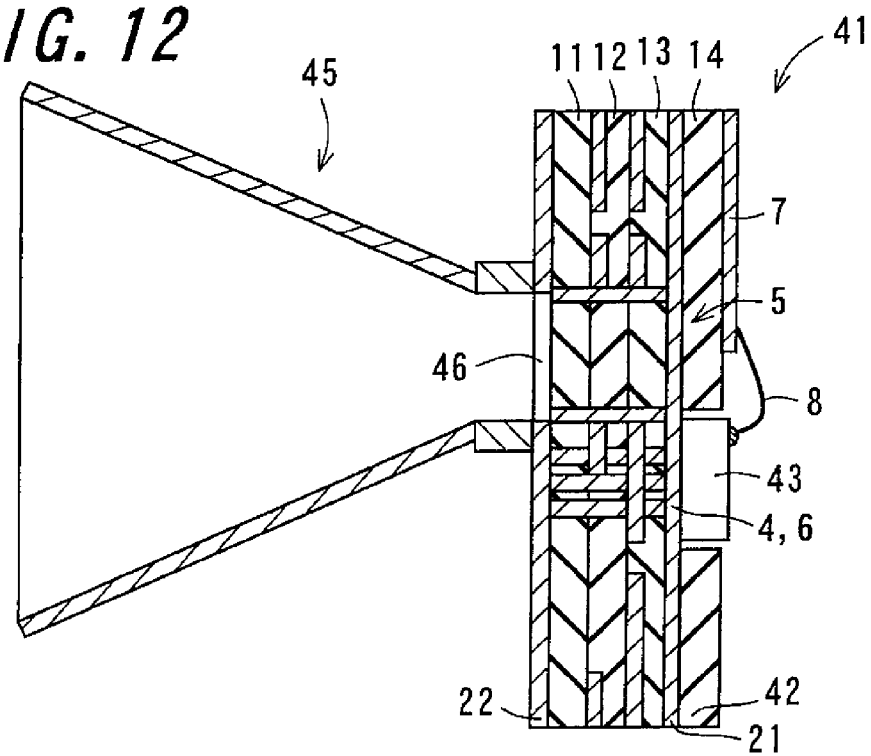
FIG. 12 is a cross-sectional view showing a transmitter according to an eighth embodiment of the invention.

FIG. 12 is a cross-sectional view showing a transmitter according to an eighth embodiment of the invention. The transmitter of this embodiment has a configuration in which the transmitting antenna 45 of the transmitter 41 shown in FIGS. 9 and 10 is implemented by means of a horn antenna, and the other portions of the configuration are similar to those of the transmitter 41. The horn antenna is disposed so as to have an opening facing an antenna port 46. This sort of configuration can also achieve a similar effect to that of the transmitter 41.

Ninth Embodiment

Figure 13:
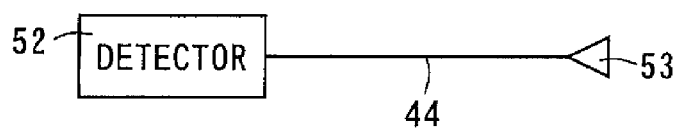
FIG. 13 is a schematic diagram showing the configuration of a receiver according to a ninth embodiment of the invention.

FIG. 13 is a schematic diagram showing the configuration of a receiver 51 according to a ninth embodiment of the invention. The receiver 51 has a high-frequency circuit module including a high-frequency circuit board that is implemented by means of any one of the high-frequency circuit boards of the foregoing embodiments and the high-frequency oscillator 43 that is mounted on the mounting portion 4 and that detects a high-frequency signal, and a receiving antenna 53. The high-frequency circuit board 42 of this embodiment is similar to the high-frequency circuit board 42 of the foregoing embodiments, and thus, a description thereof will be omitted.

The high-frequency circuit board 42 includes a transmission line 44 that has the one end 44a connected to the high-frequency detector 52, that has at another end thereof the antenna port 46 electromagnetically coupled to the receiving antenna 53 that captures a high-frequency signal, and that transmits a high-frequency signal captured by the receiving antenna 53. This transmission line 44 is configured from the connector 8, the above-described planar line 7, and the waveguide 5 as in the above-described transmission line 44.

A high-frequency signal captured by the receiving antenna 53 is transmitted through the transmission line 44 and detected by the high-frequency detector 52. This high-frequency detector 52 is mounted on the mounting portion 4. As described above, heat generated in the high-frequency detector 52 is conducted to the waveguide 5 constituting a part of the transmission line 44, and efficiently radiated. Thus, the temperature of the high-frequency detector 52 can be prevented from being high, and a receiver 51 having a high detection output can be implemented.

Furthermore, the fixing conductor 47 is connected to the waveguide 5. Thus, heat generated in the high-frequency detector 52 is conducted via the waveguide 5 to the fixing conductor 47, and radiated. Thereby, the temperature of the high-frequency detector 52 can be more effectively prevented from being high.

Tenth Embodiment

Figure 14:
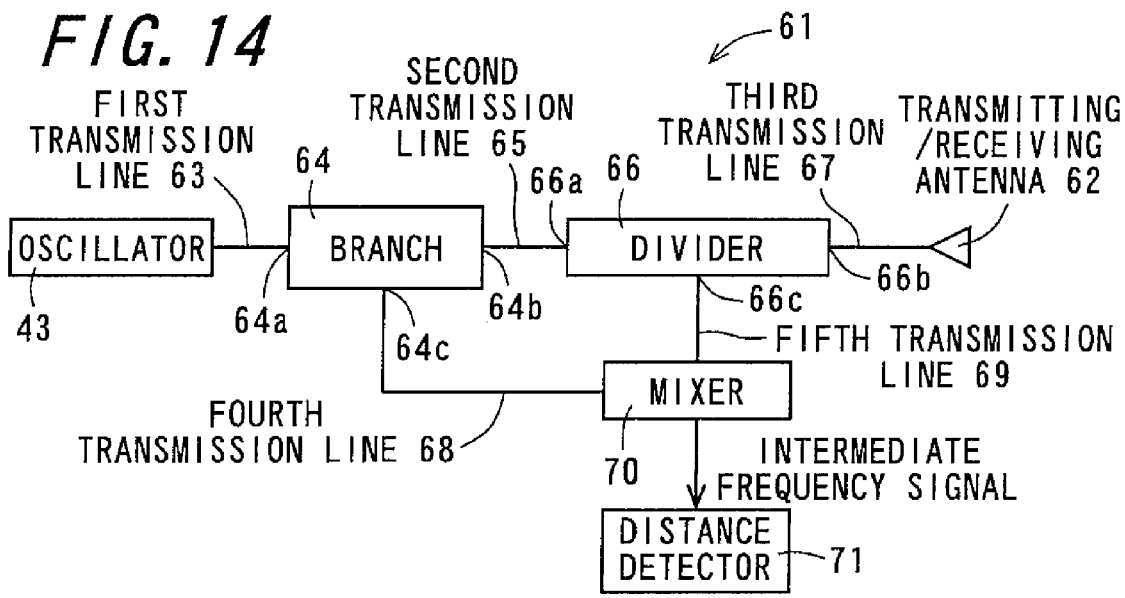
FIG. 14 is a schematic diagram showing the configuration of a radar apparatus according to a tenth embodiment of the invention.

FIG. 14 is a schematic diagram showing the configuration of a radar apparatus 61 according to a tenth embodiment of the invention. The radar apparatus 61 has a high-frequency circuit module including a high-frequency circuit board 42 that is implemented by means of any one of the high-frequency circuit boards of the foregoing embodiments and the high-frequency oscillator 43 that is mounted on the mounting portion 4 and that generates a high-frequency signal, and a transmitting/receiving antenna 62.

The high-frequency circuit board 42 has a first transmission line 63, a branch 64, a second transmission line 65, a divider 66, a third transmission line 67, a fourth transmission line 68, a fifth transmission line 69, and a mixer 70. The first transmission line 63 is connected to the high-frequency oscillator 43, and transmits a high-frequency signal. The branch 64 has first, second, and third terminals 64a, 64b, and 64c, is connected to the first transmission line 63 at the first terminal 64a, and outputs a high-frequency signal given to the first terminal 64a, to the second terminal 64b or the third terminal 64c. The second transmission line 65 is connected to the second terminal 64b, and transmits a high-frequency signal given from the second terminal 64b. The divider 66 has fourth, fifth, and sixth terminals 66a, 66b, and 66c, outputs a high-frequency signal given via the second transmission line 65 to the fourth terminal 66a, to the fifth terminal 66b, and outputs a high-frequency signal given to the fifth terminal 66b, to the sixth terminal 66c. The third transmission line 67 has at one end thereof an antenna port electromagnetically coupled to a transmitting/receiving antenna that emits and captures a high-frequency signal, has another end connected to the fifth terminal 66b, transmits a high-frequency signal output from the fifth terminal 66b, and transmits a high-frequency signal to the fifth terminal 66b. The fourth transmission line 68 is connected to the third terminal 64c, and transmits a high-frequency signal output from the third terminal 64c. The fifth transmission line 69 is connected to the sixth terminal 66c, and transmits a high-frequency signal output from the sixth terminal 66c. The mixer 70 is connected to the fourth and the fifth transmission lines 68 and 69, and mixes high-frequency signals given from the fourth and the fifth transmission lines 68 and 69 and outputs an intermediate frequency signal.

The high-frequency circuit board 42 further has a distance detector 71 that detects the distance from the high-frequency circuit module to a search target based on an intermediate frequency signal from the mixer.

The branch (switch) 64 selectively outputs a high-frequency signal given to the first terminal 64a, to the second terminal 64b and the third terminal 64c. The branch 64 is implemented, for example, as a high-frequency switching element. The branch 64 is given a control signal from a control portion (not shown), and selectively connects the first terminal 64a and the second terminal 64b, or the first terminal 64a and the third terminal 64c, based on the control signal.

The radar apparatus 61 is implemented by means of a pulsed radar. The control portion connects the first terminal 64a and the second terminal 64b to output a pulsed high-frequency signal from the second terminal 64b, and then connects the first terminal 64a and the third terminal 64c to output a high-frequency signal from the third terminal 64c. The radar apparatus 61 may be implemented by means of an FM-CW radar in which a voltage-controlled oscillator is used as the oscillator, or may be implemented by means of a dual-frequency CW radar, an FM pulsed radar, a spread spectrum radar, or the like.

The divider 66 outputs a high-frequency signal given to the fourth terminal 66a, to the fifth terminal 66b, and outputs a high-frequency signal given to the fifth terminal 66b, to the sixth terminal 66c. The divider 66 is implemented by means of a hybrid circuit or a circulator. The hybrid circuit is implemented by means of a directional coupler, a branch line, a magic T, a rat-race coupler, or the like.

A high-frequency signal generated by the high-frequency oscillator 43 passes through the first transmission line 63, is given via the branch 64, the second transmission line 65, the divider 66, and the third transmission line 67 to the transmitting/receiving antenna 62, and is emitted from the transmitting/receiving antenna 62 as radio waves. Furthermore, a high-frequency signal generated by the high-frequency oscillator 43 passes through the first transmission line 63, and is given via the branch 64 and the fourth transmission line 68 to the mixer 70 as a local signal.

When radio waves arriving from the outside are received by the transmitting/receiving antenna 62, the transmitting/receiving antenna 62 gives a high-frequency signal based on the radio waves to the third transmission line 67, and the signal is given via the divider 66 and the fifth transmission line 69 to the mixer 70.

The mixer 70 mixes high-frequency signals given from the fourth and the fifth transmission lines 68 and 69 and outputs an intermediate frequency signal. The intermediate frequency signal output from the mixer 70 is given to the distance detector 71.

The distance detector 71 includes the above-described high-frequency detector 52, and calculates the distance to a detection target based on the intermediate frequency signal obtained by receiving radio waves emitted from the transmitting/receiving antenna 62 and reflected by the detection target (echo). The distance detector 71 is implemented, for example, by means of a microcomputer.

In this embodiment, the above-described waveguide 5 forms at least a part of at least any one of the first to the fifth transmission lines 63, 65, 67, 68, and 69. For example, the waveguide 5 with the above-described antenna port 46 may form a part of the third transmission line 67, and this waveguide 5 and the mounting portion 4 may be connected to each other via the heat conductor 6. Also, the waveguide 5 constituting at least a part of the first to the fifth transmission lines 63, 65, 67, 68, and 69 and the mounting portion 4 may be connected to each other via the heat conductor 6.

According to the above-described radar apparatus 61, the high-frequency oscillator 43 is mounted on the mounting portion 4. As described above, heat generated in the high-frequency oscillator 43 is conducted to the waveguide 5 and efficiently radiated. Thus, the temperature of the high-frequency oscillator 43 can be prevented from being high, a transmitter and receiver having a high detection output can be implemented, and, for example, the reliability of an intermediate frequency signal generated by the mixer 70 can be improved. Thereby, a radar apparatus 61 that can accurately detect the distance to a detection target can be implemented.

In the radar apparatus 61 of this embodiment, the high-frequency oscillator 43 was mounted on the mounting portion 4, but each of the branch 64, the divider 66, the mixer 70, and the distance detector 71 may be mounted on the mounting portion 4. In this case, heat generated in the branch 64, the divider 66, the mixer 70, and the distance detector 71 is conducted via the heat conductor 6 to the waveguide 5, and efficiently radiated.

Eleventh Embodiment

Figure 15:
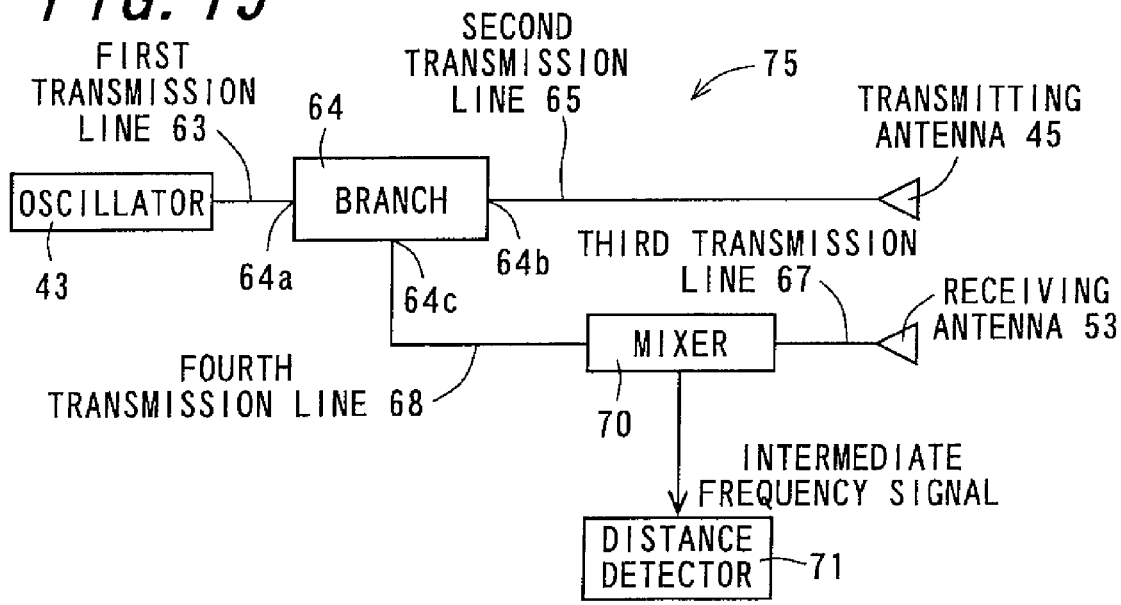
FIG. 15 is a schematic diagram showing the configuration of a radar apparatus according to an eleventh embodiment of the invention.

FIG. 15 is a schematic diagram showing the configuration of a radar apparatus 75 according to an eleventh embodiment of the invention. The radar apparatus 75 has a high-frequency circuit module including a high-frequency circuit board 42 that is implemented by means of any one of the high-frequency circuit boards of the foregoing embodiments and the high-frequency oscillator 43 that is mounted on the mounting portion 4 and that generates a high-frequency signal, the transmitting antenna 45, and the receiving antenna 53. In the radar apparatus 75 of this embodiment, portions in the configuration corresponding to those in the radar apparatus 61 shown in FIG. 14 are denoted by the same reference numerals, and a description thereof will not be repeated.

The high-frequency circuit board 42 has the first transmission line 63, the branch 64, the second transmission line 65, the third transmission line 67, the fourth transmission line 68, and the mixer 70. The first transmission line 63 is connected to the high-frequency oscillator 43, and transmits a high-frequency signal. The branch 64 has first, second, and third terminals 64a, 64b, and 64c, is connected to the first transmission line 63 at the first terminal 64a, and selectively outputs a high-frequency signal given to the first terminal 64a, to the second terminal 64b or the third terminal 64c. The second transmission line 65 includes at one end thereof a transmitting antenna port electromagnetically coupled to the transmitting antenna 45 that emits a high-frequency signal, has another end connected to the second terminal 64b, and transmits a high-frequency signal given from the second terminal 64b. The third transmission line 67 includes at one end thereof a receiving antenna port electromagnetically coupled to the receiving antenna 53 that captures a high-frequency signal, and transmits the captured high-frequency signal. The fourth transmission line 68 has one end connected to the third terminal 64c, and transmits a high-frequency signal output from the third terminal 64c. The mixer 70 is connected to the other end of the third transmission line 67 and the other end of the fourth transmission line 68, and mixes high-frequency signals given from the third and the fourth transmission lines and outputs an intermediate frequency signal.

The high-frequency circuit board 42 further has the distance detector 71 that detects the distance from the high-frequency circuit module to a search target based on an intermediate frequency signal from the mixer.

A high-frequency signal generated by the high-frequency oscillator 43 passes through the first transmission line 63, is given via the branch 64 and the second transmission line 65 to the transmitting antenna 45, and emitted from the transmitting antenna 45 as radio waves. Furthermore, a high-frequency signal generated by the high-frequency oscillator 43 passes through the first transmission line 63, and is given via the branch 64 and the fourth transmission line 68 to the mixer 70 as a local signal.

When radio waves arriving from the outside are received by the receiving antenna 53, the receiving antenna 53 gives a high-frequency signal based on the radio waves to the third transmission line 67, and the signal is given to the mixer 70.

The mixer 70 mixes high-frequency signals given from the third and the fourth transmission lines 67 and 68 and outputs an intermediate frequency signal. The intermediate frequency signal output from the mixer 70 is given to the distance detector 71.

In this embodiment, the above-described waveguide 5 forms at least a part of at least any one of the first to the fourth transmission lines 63, 65, 67, and 68. For example, the waveguide 5 with the above-described antenna port 46 may form a part of the second and the third transmission lines 65 and 67, and this waveguide 5 and the mounting portion 4 may be connected to each other via the heat conductor 6. Also, the waveguide 5 constituting at least a part of the first to the fourth transmission lines 63, 65, 67, 68, and 69 and the mounting portion 4 may be connected to each other via the heat conductor 6.

According to the above-described radar apparatus 75, the high-frequency oscillator 43 is mounted on the mounting portion 4. As described above, heat generated in the high-frequency oscillator 43 is conducted to the waveguide 5 and efficiently radiated. Thus, the temperature of the high-frequency oscillator 43 can be prevented from being high, a transmitter and receiver having a high detection output can be implemented, and, for example, the reliability of an intermediate frequency signal generated by the mixer 70 can be improved. Thereby, a radar apparatus 75 that can accurately detect the distance to a detection target can be implemented.

Twelfth Embodiment

Figure 16:
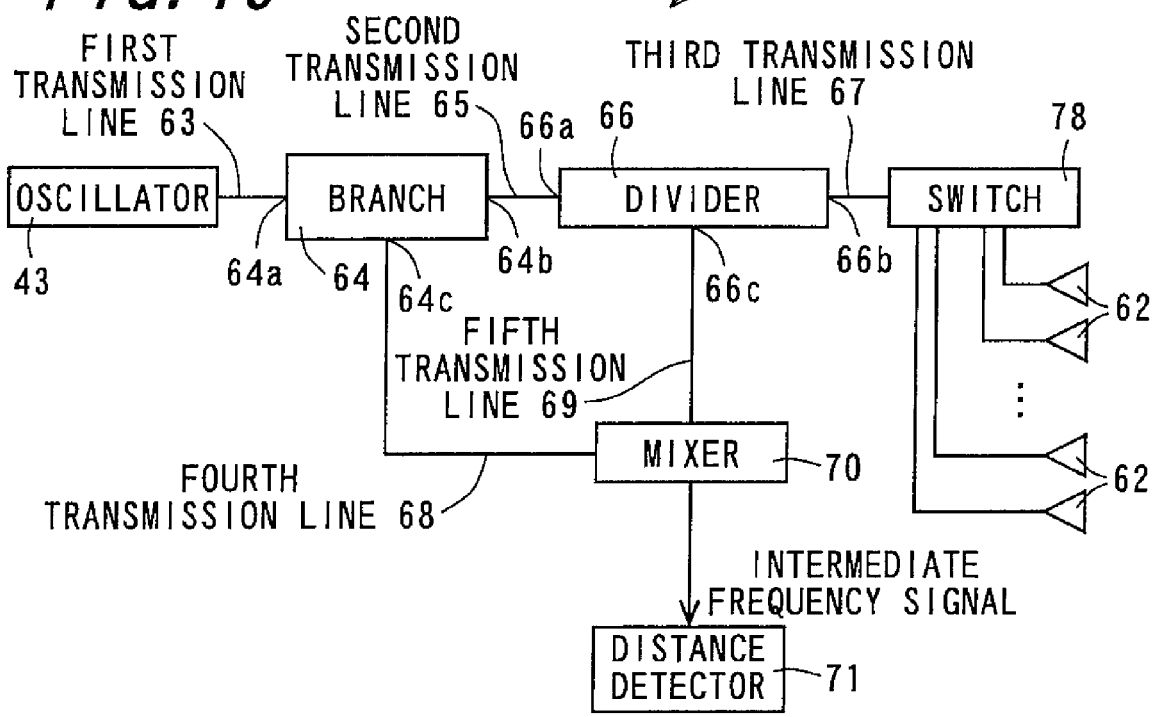
FIG. 16 is a schematic diagram showing the configuration of a radar apparatus according to a twelfth embodiment of the invention.

FIG. 16 is a schematic diagram showing the configuration of a radar apparatus 77 according to a twelfth embodiment of the invention. The radar apparatus 77 of this embodiment has substantially a similar configuration to that of the radar apparatus 61 of the tenth embodiment shown in FIG. 14, and thus, corresponding portions in the configuration are denoted by the same reference numerals, and a description thereof will not be repeated.

The third transmission line 67 of this embodiment comprises a plurality of antenna ports at the another end thereof, and a switch 78 which can selectively connect the one end of the third transmission line and any one of the plurality of antenna ports. Furthermore, the radar apparatus 77 has a plurality of transmitting/receiving antennas 62 electromagnetically coupled to the respective antenna ports.

The switch 78 is given a control signal from a control portion (not shown), and selectively connects the one end and any one of the plurality of antenna ports based on the control signal. The switch 78 is implemented, for example, by means of a high-frequency switching element, as in the above-described branch 64.

For example, when the plurality of transmitting/receiving antennas 62 sequentially and selectively send radio waves and the plurality of transmitting/receiving antennas 62 sequentially and selectively receive radio waves, a radar apparatus 77 that detects the direction, the distance, the relative speed, and the like of a detection target can be implemented.

Thirteenth Embodiment

Figure 17:
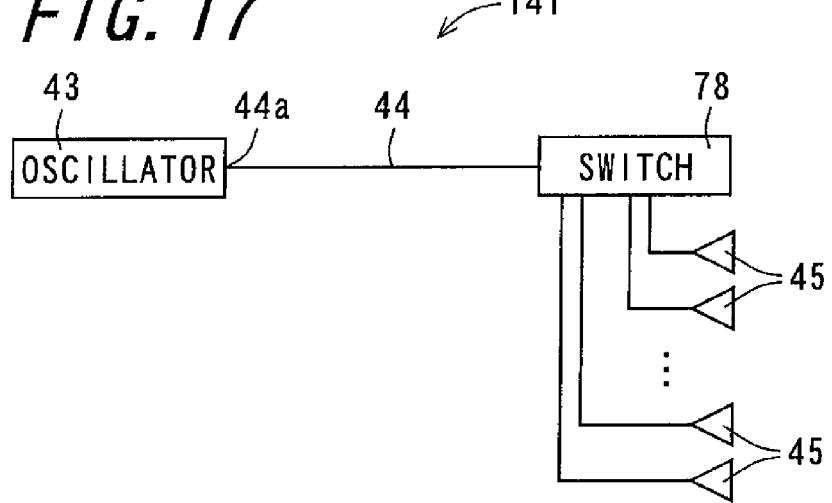
FIG. 17 is a schematic diagram showing the configuration of a transmitter according to a thirteenth embodiment of the invention.

FIG. 17 is a schematic diagram showing the configuration of a transmitter 141 according to a thirteenth embodiment of the invention. The transmitter 141 of this embodiment has substantially a similar configuration to that of the transmitter 41 of the seventh embodiment shown in FIG. 11, and thus, corresponding portions in the configuration are denoted by the same reference numerals, and a description thereof will not be repeated. The transmitter 41 has one transmitting antenna 45, but the transmitter 141 has a plurality of transmitting antennas 45. In this case, the transmission line 44 comprises a plurality of antenna ports at the another end thereof, and the switch 78 which can selectively connect the one end of the transmission line and any one of the plurality of antenna ports. The plurality of transmitting antennas 45 are respectively electromagnetically coupled to the antenna ports. This sort of transmitter 41 can sequentially and selectively send radio waves from the plurality of transmitting antennas 45.

Fourteenth Embodiment

Figure 18:
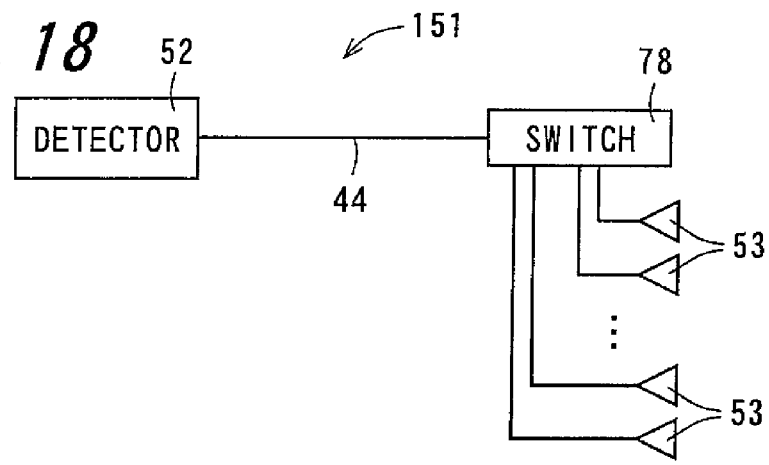
FIG. 18 is a schematic diagram showing the configuration of a receiver according to a fourteenth embodiment of the invention.

FIG. 18 is a schematic diagram showing the configuration of a receiver 151 according to a fourteenth embodiment of the invention. The receiver 151 of this embodiment has substantially a similar configuration to that of the receiver 51 of the ninth embodiment shown in FIG. 13, and thus, corresponding portions in the configuration are denoted by the same reference numerals, and a description thereof will not be repeated. The receiver 51 has one receiving antenna 53, but the receiver 151 has a plurality of receiving antennas 53. In this case, the transmission line 44 comprises a plurality of antenna ports at the another end thereof, and the switch 78 which can selectively connect the one end of the transmission line and any one of the plurality of antenna ports. The plurality of receiving antennas 53 are respectively electromagnetically coupled to the antenna ports. This sort of receiver 51 can sequentially and selectively receive radio waves at the plurality of receiving antennas 53.

Fifteenth Embodiment

Figure 19:
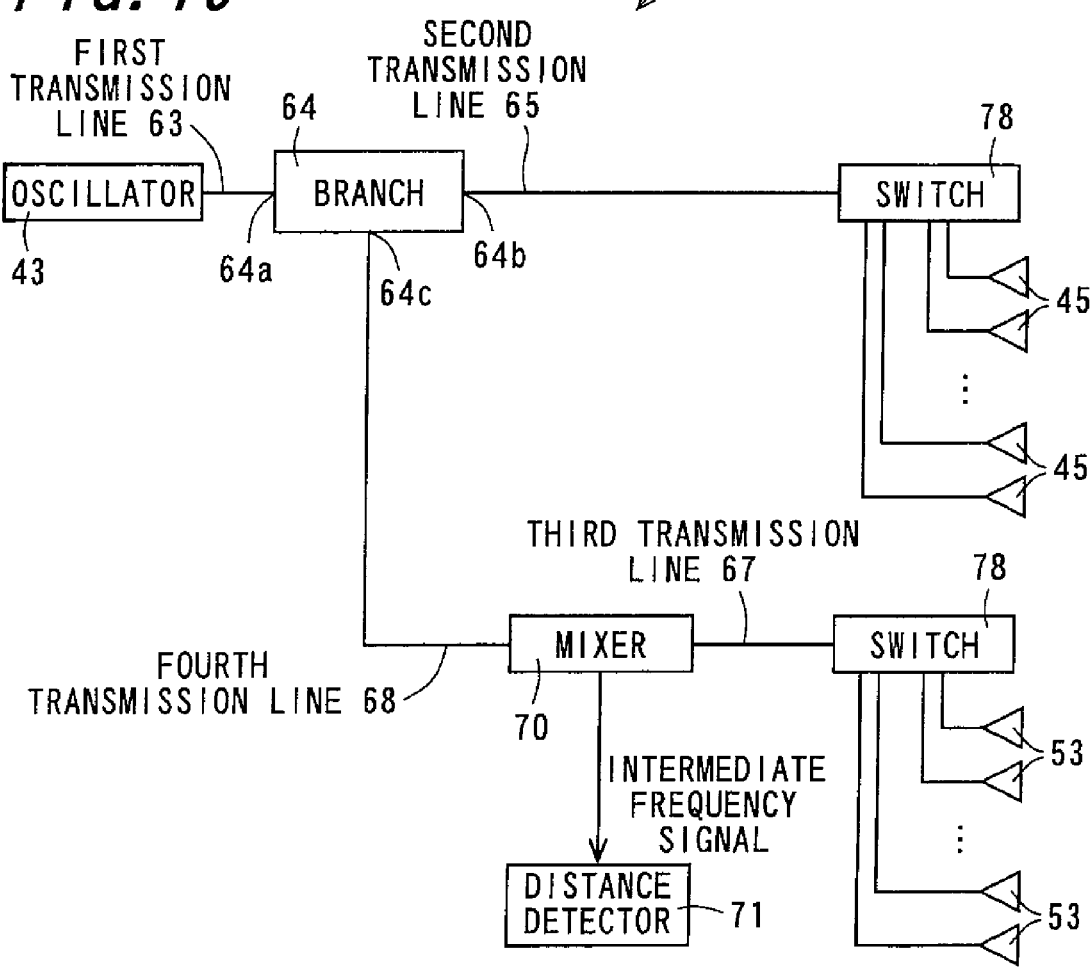
FIG. 19 is a schematic diagram showing the configuration of a radar apparatus according to a fifteenth embodiment of the invention.

FIG. 19 is a schematic diagram showing the configuration of a radar apparatus 175 according to a fifteenth embodiment of the invention. The radar apparatus 175 of this embodiment has substantially a similar configuration to that of the radar apparatus 75 of the eleventh embodiment shown in FIG. 15, and thus, corresponding portions in the configuration are denoted by the same reference numerals, and a description thereof will not be repeated. The radar apparatus 75 has one transmitting antenna 45 and one receiving antenna 53, but the radar apparatus 175 has a plurality of transmitting antennas 45 and a plurality of receiving antennas 53. In the case where a plurality of transmitting antennas 45 are provided, the second transmission line 65 comprises a plurality of antenna ports at the one end thereof, and the switch 78 which can selectively connect the another end of the second transmission line and any one of the plurality of antenna ports, and the transmitting antennas 45 are respectively electromagnetically coupled to the antenna ports. Furthermore, in the case where a plurality of receiving antennas 53 are provided, the third transmission line 67 comprises a plurality of antenna ports at the another end thereof, and the switch 78 which can selectively connect the one end of the third transmission line and any one of the plurality of antenna ports, and the receiving antennas 53 are respectively electromagnetically coupled to the antenna ports. In this sort of radar apparatus 75, for example, when a plurality of transmitting/receiving antennas 62 sequentially and selectively send radio waves and a plurality of transmitting/receiving antennas 62 sequentially and selectively receive radio waves, the direction, the distance, the relative speed, and the like of a detection target can be detected. The radar apparatus 175 has both a plurality of transmitting antennas 45 and a plurality of receiving antennas 53, but either the number of transmitting antennas 45 or the number of receiving antennas 53 may be plural.

The transmitting antennas 45, the receiving antennas 53, and the transmitting/receiving antennas 62 in the foregoing embodiments may be implemented, for example, by means of a planar antenna such as a patch antenna or a slot antenna, a lens antenna, a phased array antenna, a switch antenna, a notch antenna, a parabolic antenna, or the like.

Furthermore, in the high-frequency circuit boards of the foregoing embodiments, an antenna having a function similar to that of at least any one of the transmitting antennas 45, the receiving antennas 53, and the transmitting/receiving antenna 62 may be connected together with the high-frequency circuit boards. Examples of such an antenna connected together with the high-frequency circuit boards include a slot antenna using a slot formed in the lower-face conductive layer 22.

Furthermore, in the high-frequency circuit boards of the foregoing embodiments, the waveguides 5 may be respectively formed at a plurality of heights in the thickness direction of the dielectric substrate 3. For example, a plurality of waveguides 5 may be formed so as to overlap each other in the thickness direction of the dielectric substrate 3.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

The invention claimed is:

1. A high-frequency circuit board, comprising:
   a dielectric substrate;
   a mounting portion which is disposed on a first surface of the dielectric substrate and on which an electronic component is to be mounted;
   a waveguide formed in the dielectric substrate,
   the waveguide comprising:
      a pair of main conductive layers which extend in a same direction so that surfaces thereof oppose each other, and are electrically conductive; and
      a plurality of conductive columns which are electrically conductive, which are formed throughout a portion between the pair of main conductive layers, and which are arranged in two lines along a transmitting direction of an electrical signal so that a distance therebetween in the transmitting direction is equal to or shorter than a cutoff wavelength; and
   a heat conductor which is formed throughout a portion between the mounting portion and the waveguide and has a thermal conductivity higher than a thermal conductivity of the dielectric substrate.

2. The high-frequency circuit board of claim 1, wherein a part of the waveguide, the mounting portion, and the heat conductor are connected together.

3. The high-frequency circuit board of claim 1, wherein
   the waveguide is formed at a position away from the first surface of the dielectric substrate, and
   the high-frequency circuit board further comprises:
      a grounding conductive layer which is formed so as to extend from one of the pair of main conductive layers closer to the first surface of the dielectric substrate, and is connected together with the one of the pair of main conductive layers; and
      a line which is disposed on the first surface of the dielectric substrate, in a region where the grounding conductive layer is formed when viewed from one side in a thickness direction of the dielectric substrate, and is electrically conductive.

4. A high-frequency circuit module, comprising:
the high-frequency circuit board of claim 1; and
a high-frequency oscillator which is mounted on the mounting portion and generates a high-frequency signal, wherein
the high-frequency circuit board comprises a transmission line comprising one end connected to the high-frequency oscillator, transmitting a high-frequency signal from the high-frequency oscillator, and comprising at another end thereof at least one antenna port electromagnetically coupled to a at least one transmitting antenna that emits a high-frequency signal, and
the waveguide constitutes at least a part of the transmission line.

5. The high-frequency circuit module of claim 4, wherein the transmission line comprises
the at least one antenna port comprising a plurality of antenna ports,
the at least one transmitting antenna comprising a plurality of transmitting antennas, and
a switch which can selectively connect the one end of the transmission line and any one of the plurality of antenna ports.

6. A high-frequency circuit module, comprising:
the high-frequency circuit board of claim 1; and
a high-frequency detector which is mounted on the mounting portion and detects a high-frequency signal, wherein
the high-frequency circuit board comprises a transmission line comprising one end connected to the high-frequency detector, comprising at another end thereof at least one antenna port electromagnetically coupled to at least one receiving antenna that captures a high-frequency signal, and transmitting a high-frequency signal given from the antenna port, and
the waveguide constitutes at least a part of the transmission line.

7. A high-frequency circuit module, comprising:
the high-frequency circuit board of claim 1; and
a high-frequency oscillator which is mounted on the mounting portion and generates a high-frequency signal, wherein
the high-frequency circuit board comprises:
a first transmission line which is connected to the high-frequency oscillator and transmits a high-frequency signal;
a branch which comprises a first terminal, a second terminal, and a third terminal, which is connected to the first transmission line at the first terminal, and which selectively outputs a high-frequency signal given to the first terminal, to the second terminal or the third terminal;
a second transmission line which is connected to the second terminal and transmits a high-frequency signal given from the second terminal;
a divider which comprises a fourth terminal, a fifth terminal, and a sixth terminal, which outputs a high-frequency signal given via the second transmission line to the fourth terminal, to the fifth terminal, and which outputs a high-frequency signal given to the fifth terminal, to the sixth terminal;
a third transmission line which comprises one end connected to the fifth terminal, which comprises at another end thereof at least one antenna port electromagnetically coupled to at least one transmitting/receiving antenna that emits and captures a high-frequency signal, which transmits a high-frequency signal output from the fifth terminal, to the antenna port, and which transmits a high-frequency signal given from the antenna port, to the fifth terminal;
a fourth transmission line which is connected to the third terminal and transmits a high-frequency signal output from the third terminal;
a fifth transmission line which is connected to the sixth terminal and transmits a high-frequency signal output from the sixth terminal; and
a mixer which is connected to the fourth and the fifth transmission lines, and mixes high-frequency signals given from the fourth and the fifth transmission lines and outputs an intermediate frequency signal,
the waveguide constitutes at least a part of at least any one of the first to the fifth transmission lines.

8. The high-frequency circuit module of claim 7, wherein the divider is constituted by a hybrid circuit or a circulator.

9. The high-frequency circuit module of claim 7, wherein the third transmission line comprises
the at least one antenna port comprising a plurality of antenna ports, and
a switch which can selectively connect the one end of the third transmission line and any one of the plurality of antenna ports.

10. A radar apparatus, comprising:
the high-frequency circuit module of claim 7, wherein
the at least one transmitting/receiving antenna is electromagnetically coupled to the at least one antenna port; and
a distance detector detects a distance from the high-frequency circuit module to a detection target based on an intermediate frequency signal from the mixer.

11. A high-frequency circuit module, comprising:
the high-frequency circuit board of claim 1; and
a high-frequency oscillator which is mounted on the mounting portion and generates a high-frequency signal, wherein
the high-frequency circuit board comprises:
a first transmission line which is connected to the high-frequency oscillator and transmits a high-frequency signal;
a branch which comprises a first terminal, a second terminal, and a third terminal, which is connected to the first transmission line at the first terminal, and which selectively outputs a high-frequency signal given to the first terminal, to the second terminal or the third terminal;
a second transmission line which comprises at one end thereof at least one transmitting antenna port electromagnetically coupled to at least one transmitting antenna that emits a high-frequency signal, which comprises another end connected to the second terminal, and which transmits a high-frequency signal given from the second terminal, to the transmitting antenna port;
a third transmission line which comprises at one end thereof at least one receiving antenna port electromagnetically coupled to at least one receiving antenna that captures a high-frequency signal, and transmits a high-frequency signal given from the receiving antenna port;
a fourth transmission line which comprises one end connected to the third terminal and transmits a high-frequency signal output from the third terminal; and a mixer which is connected to the another end of the third transmission line and the another end of the fourth transmission line, and mixes high-frequency signals given from the third and the fourth transmission lines and outputs an intermediate frequency signal, the wave guide constitutes at least a part of at least any one of the first to the fourth transmission lines.

12. The high-frequency circuit module of claim 11, wherein the second transmission line comprises the at least one transmitting antenna port comprising a plurality of transmitting antenna ports, the at least one transmitting antenna comprising a plurality of transmitting antennas, and a switch which can selectively connect the another end of the second transmission line and any one of the plurality of transmitting antenna ports.

13. The high-frequency circuit module of claim 11, wherein the third transmission line comprises the at least one receiving antenna port comprising a plurality of receiving antenna ports, the at least one receiving antenna comprising a plurality of receiving antennas, and a switch which can selectively connect the another end of the third transmission line and any one of the plurality of receiving antenna ports.

14. The high-frequency circuit module of claim 11, wherein the second transmission line comprises the at least one transmitting antenna port comprising a plurality of transmitting antenna ports, the at least one transmitting antenna comprising a plurality of transmitting antennas, and switch that can selectively connect the another end of the second transmission line and any one of the plurality of transmitting antenna ports, and the third transmission line comprises the at least one receiving antenna port comprising a plurality of receiving antenna ports, the at least one receiving antenna comprising a plurality of receiving antennas, and a switch that can selectively connect the another end of the third transmission line and any one of the plurality of receiving antenna ports.

15. A radar apparatus, comprising:

the high-frequency circuit module of claim 11, wherein the at least one transmitting antenna is electromagnetically coupled to the at least one transmitting antenna port;

the at least one receiving antenna is electromagnetically coupled to the at least one receiving antenna port; and a distance detector detects a distance from the high-frequency circuit module to a detection target based on an intermediate frequency signal from the mixer.

16. The high-frequency circuit board of claim 1, wherein the waveguide is formed so that a transmitting direction of an electric signal therethrough is parallel to the first surface of the dielectric substrate.

17. The high-frequency circuit board of claim 1, wherein at least one of the waveguide or the heat conductor comprises a path to a second surface of the dielectric substrate.

18. A high-frequency circuit board comprising
a dielectric substrate;
a mounting portion which is disposed on a first surface of the dielectric substrate and on which an electronic component is to be mounted;
a waveguide formed in the dielectric substrate,
the waveguide comprising:
a pair of main conductive layers which extend in a same direction so that surfaces thereof oppose each other, and are electrically conductive;
a plurality of conductive columns which are electrically conductive, which are formed throughout a portion between the pair of main conductive layers, and which are arranged in two lines along a transmitting direction of an electrical signal so that a distance therebetween in the transmitting direction is equal to or shorter than a cutoff wavelength; and
at least a pair of sub conductive layers which extend in the transmitting direction of an electrical signal, which each electrically connect the plurality of conductive columns constituting each line of the two lines, and which is electrically conductive; and
a heat conductor which is formed throughout a portion between the mounting portion and the waveguide and has a thermal conductivity higher than a thermal conductivity of the dielectric substrate.

19. A high-frequency circuit board comprising:
a dielectric substrate;
a mounting portion which is disposed on a first surface of the dielectric substrate and on which an electronic component is to be mounted;
a waveguide formed in the dielectric substrate; and
a heat conductor which is formed throughout a portion between the mounting portion and the waveguide and has a thermal conductivity higher than a thermal conductivity of the dielectric substrate,
wherein the waveguide is formed at a position away from the first surface of the dielectric substrate, the dielectric substrate comprises a cavity which is continued from the first surface to the waveguide, and a portion of the waveguide exposed through the cavity in the dielectric substrate, the mounting portion, and the heat conductor are connected together.

* * * * *